United States Patent [19]

Ohinishi et al.

[11] Patent Number: 5,216,313
[45] Date of Patent: Jun. 1, 1993

[54] ULTRASONIC WAVE LINEAR MOTOR

[75] Inventors: Kazumasa Ohinishi; Koichi Naito; Toru Nakazawa, all of Nagaoka, Japan

[73] Assignee: Alps Electric Co., Ltd., Tokyo, Japan

[21] Appl. No.: 639,396

[22] Filed: Jan. 10, 1991

Related U.S. Application Data

[63] Continuation of Ser. No. 417,411, Oct. 5, 1989, abandoned.

[30] Foreign Application Priority Data

| Dec. 16, 1988 | [JP] | Japan | 63-318254 |
| Dec. 22, 1988 | [JP] | Japan | 63-324547 |
| Mar. 8, 1989 | [JP] | Japan | 1-26391[U] |
| Mar. 8, 1989 | [JP] | Japan | 1-26392[U] |
| Apr. 13, 1989 | [JP] | Japan | 1-43512[U] |
| Apr. 26, 1989 | [JP] | Japan | 1-49383[U] |

[51] Int. Cl.$^5$ .............................................. H01L 41/08
[52] U.S. Cl. ................................... 310/323; 310/321; 310/328
[58] Field of Search ............................ 310/321, 323, 328

[56] References Cited

U.S. PATENT DOCUMENTS

| 3,808,488 | 4/1974 | Massa | 310/328 |
| 4,548,090 | 10/1985 | Sashida | 310/323 X |
| 4,562,374 | 12/1985 | Sashida | 310/323 |
| 4,613,782 | 9/1986 | Mori et al. | 310/323 |
| 4,728,843 | 3/1988 | Mishiro | 310/323 X |
| 4,742,260 | 5/1988 | Shimizu et al. | 310/323 |
| 4,857,791 | 8/1989 | Uchino et al. | 310/323 X |
| 4,857,792 | 8/1989 | Miura et al. | 310/323 |
| 4,882,500 | 11/1989 | Iijima | 310/323 |
| 4,884,002 | 11/1989 | Eusemann et al. | 310/323 |

FOREIGN PATENT DOCUMENTS

| 0155694A2 | 9/1985 | European Pat. Off. . |
| 0313130A2 | 4/1988 | European Pat. Off. . |
| 0297574A2 | 1/1989 | European Pat. Off. . |
| 0055867 | 4/1985 | Japan | 310/323 |
| 0091879 | 5/1985 | Japan | 310/323 |
| 0156283 | 8/1985 | Japan | 310/323 |
| 0257776 | 12/1985 | Japan | 310/323 |
| 0185081 | 8/1986 | Japan | 310/323 |
| 0239875 | 10/1987 | Japan | 310/323 |
| 0011070 | 1/1988 | Japan | 310/328 |
| 0039474 | 2/1988 | Japan | 310/323 |
| 0224683 | 9/1988 | Japan | 310/323 |
| 0228979 | 9/1988 | Japan | 310/323 |
| 0257473 | 10/1988 | Japan | 310/323 |
| 0294271 | 11/1988 | Japan | 310/323 |
| 0294281 | 11/1988 | Japan | 310/323 |
| 0047282 | 2/1989 | Japan | 310/323 |
| 0144372 | 6/1989 | Japan | 310/323 |
| 0170379 | 7/1989 | Japan | 310/323 |
| 0041673 | 2/1990 | Japan | 310/323 |
| 0051371 | 2/1990 | Japan | 310/323 |
| 0266881 | 10/1990 | Japan | 310/323 |
| 0773714 | 10/1980 | U.S.S.R. | 310/323 |
| 2216732A | 10/1989 | United Kingdom . |

Primary Examiner—Mark O. Budd
Attorney, Agent, or Firm—Guy W. Shoup; David W. Heid

[57] ABSTRACT

The present invention proposes an ultrasonic wave linear motor constituted in such a way that an oscillatory element for making oscillation in a direction crossing the shaft line of an oscillatory member is attached to the oscillatory member made of an elastic body formed in a rod shape and a driven body capable of making free relative movement in a direction crossing the shaft line in relation to the above oscillatory member is arranged to abut the end of the above oscillatory member, and also proposes such a driving process that, the ultrasonic wave linear motor makes linear movement by exciting flexural oscillation and longitudinal oscillation on the above oscillatory member by means of the oscillation of an oscillatory element so that an elliptical oscillation composed of flexural oscillation and longitudinal oscillation may take place on the surface of the oscillatory member in contact with the driven body. The present invention also proposes a process for driving the oscillation frequency of the oscillatory element by means of the resonance frequency of the oscillatory member as the most efficient driving process in view of energy.

10 Claims, 26 Drawing Sheets

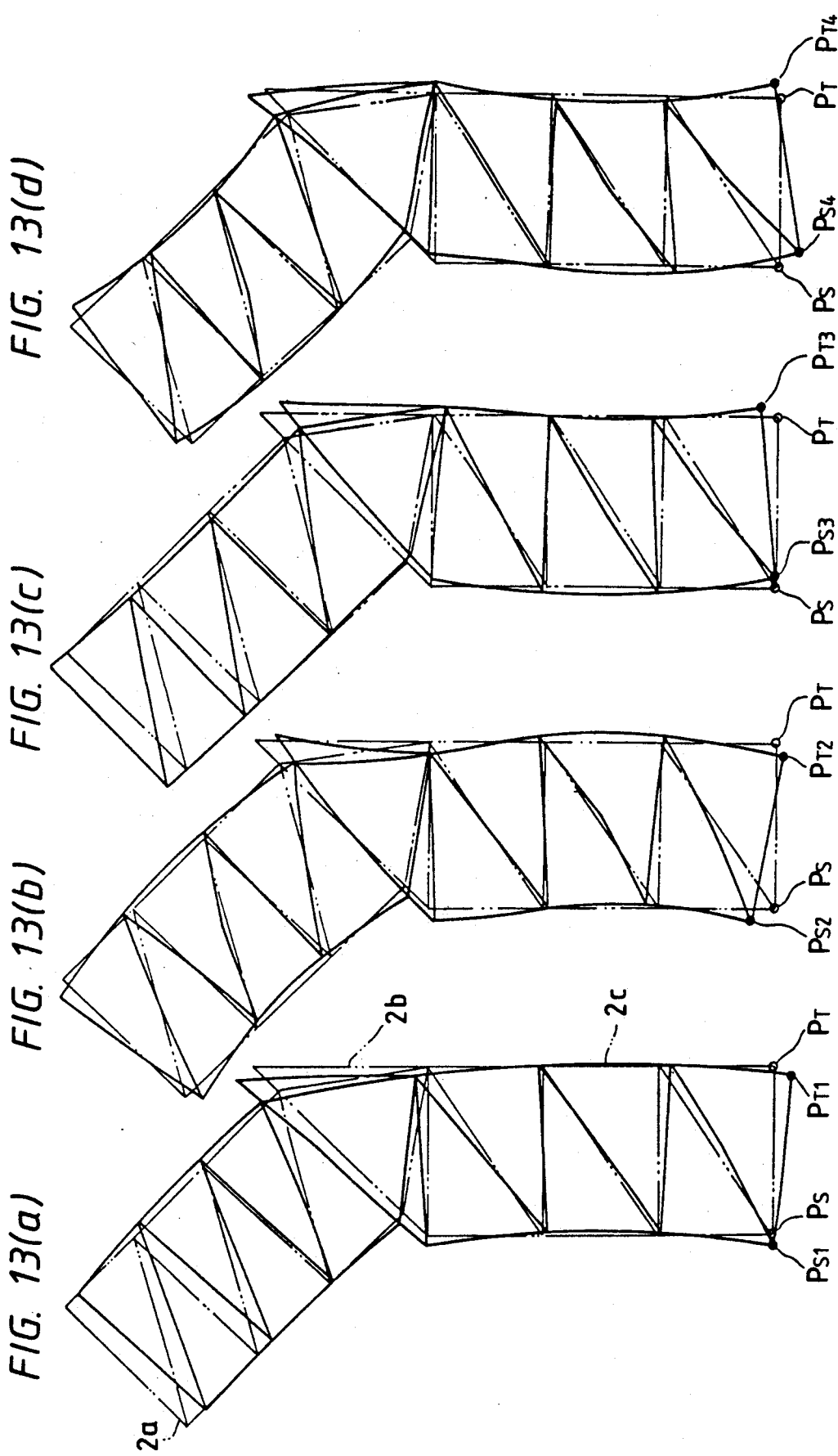

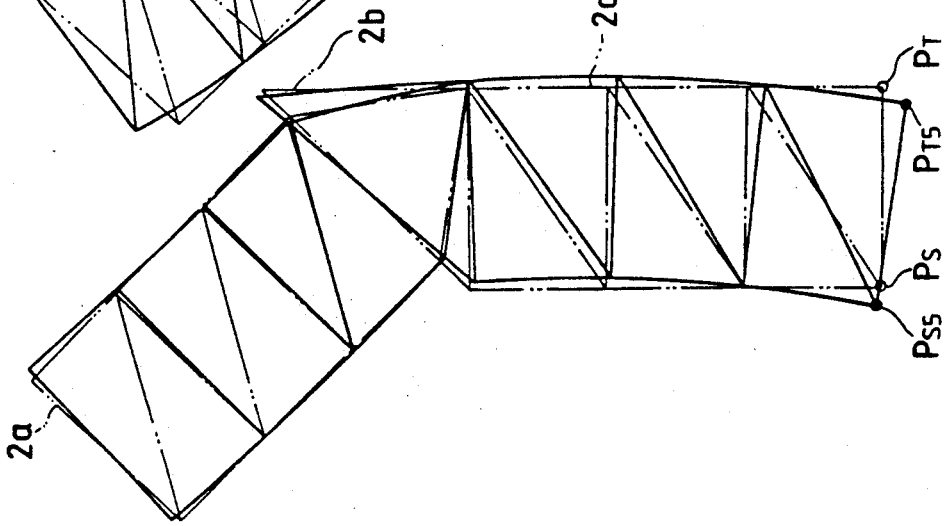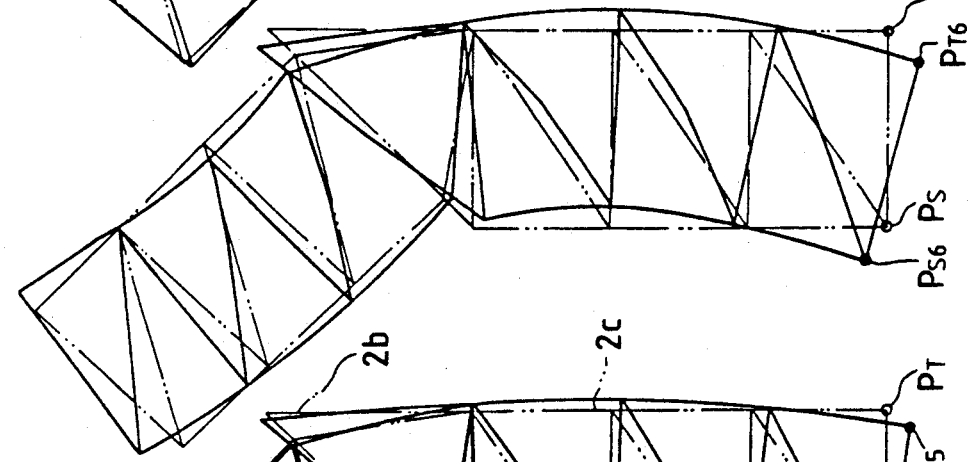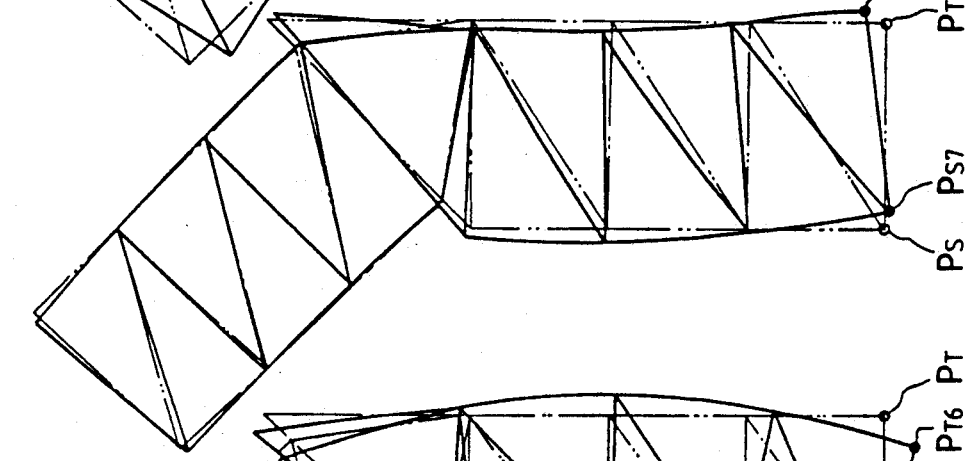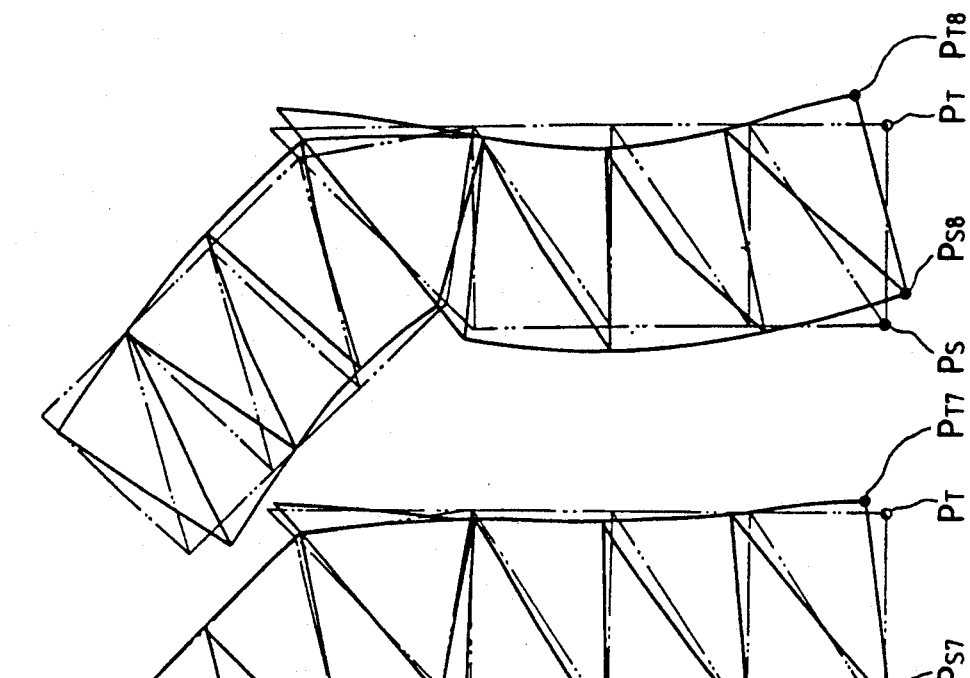

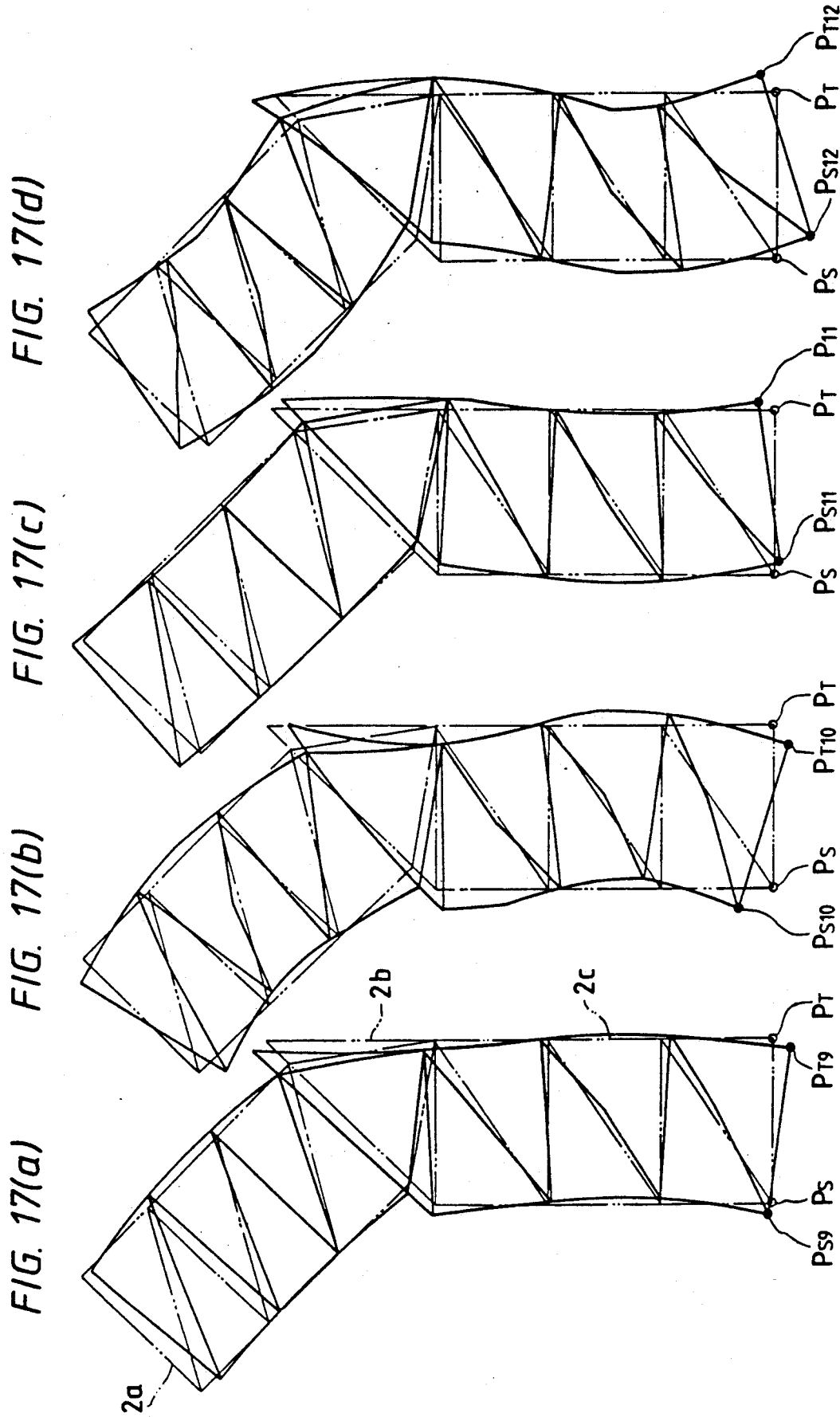

$V_1 = 5V$
$V_2 = 0V$ $V_1 = 0V$
$V_2 = 5V$ $V_1 = 5V$
$V_2 = 5V$
$\theta = 0°$ $V_1 = 5V$
$V_2 = 7V$
$\theta = 0°$ $V_1 = 5V$
$V_2 = 5V$
$\theta = 45°$ $V_1 = 5V$
$V_2 = 5V$
$\theta = 90°$ $V_1 = 5V$
$V_2 = 5V$
$\theta = 90°$ $V_1 = 5V$
$V_2 = 5V$
$\theta = 135°$ $V_1 = 5V$
$V_2 = 5V$
$\theta = 180°$ $V_1 = 5V$
$V_2 = 5V$
$\theta = 225°$ $V_1 = 5V$
$V_2 = 5V$
$\theta = 315°$

ULTRASONIC WAVE LINEAR MOTOR

This application is a continuation of application Ser. No. 07/417,411, filed Oct. 5, 1989 now abandoned.

BACKGROUND OF THE INVENTION

1. Field of the Invention

The present invention relates to an ultrasonic wave linear motor provided for the purpose of obtaining linear displacement by employing the ultrasonic wave oscillation of a piezoelectric element as a drive power supply.

2. Description of the Prior Art

Recently, an ultrasonic wave motor has been developed with ultrasonic oscillation of a piezoelectric element made of piezoelectric ceramics used as its driving power supply, and used as an actuator for various kinds of apparatus. A compact size and high torque are expected to such an ultrasonic wave motor which possesses such merits as no influence on electromagnetic medium etc. owing to no generation of electromagnetic waves.

In the ultrasonic wave motor, the oscillation of a drive body in its feed direction is arranged to be transmitted to a driven body by aid of friction by placing the oscillatory drive body in the vicinity of the driven body. The oscillation of the drive body is in form of either a slant linear oscillation composed of mutually orthogonal oscillatory components or an elliptical oscillation. Therefore, the drive body can be classified in three types, that is, an oscillatory piece type, a torsional oscillator type and an advance wave type.

The ultrasonic wave motor of oscillatory piece type drives in such a manner as shown in FIG. 44 that a piezoelectric oscillator 111 making longitudinal oscillation and an oscillatory piece 112 attached thereto are set slant to the contact surface of a driven body 113 so as to push the driven body 113 in a fixed direction so that high speed operation can be carried out with high conversion efficiency.

The ultrasonic wave motor of torsional vibrator type is formed in such a manner, as shown in FIG. 45, that an elliptical oscillation may be generated instead of the linear oscillation of the oscillatory piece type by attaching a torsion coupling element 115 to a piezoelectric oscillator 114.

The advance wave type ultrasonic motor forces a contact surface with a rotor 118 to make an elliptical oscillation, by coupling a piezoelectric element 117 to an oscillatory body 116 formed in an annular shape or a disc shape and giving a flexural oscillation wave advancing in the circumferential direction to an oscillatory body 116 as shown in FIG. 46, and this motor possesses such a merit as small wear due to a large contact area.

However, the above-mentioned every prior art has involved such tasks to be solved as follows.

Firstly, in the case of an oscillatory piece type ultrasonic wave motor, the oscillation is unstable and the direction for sending a driven body is fixed, because the contact between the oscillatory piece 112 and a driven body 113 is intermittent. Furthermore, a rotor oscillatory piece 112 involves such a problem as severe wear of its tip.

A torsional oscillatory piece type ultrasonic wave motor involves such drawbacks as difficulty, from view of its structure, to control oscillation for feeding and oscillation for controlling friction separately and to require a linear motion conversion mechanism so as to be used in form of a linear motor.

And an advance wave type ultrasonic wave motor has such drawbacks as requiring a linear conversion mechanism as stated above as well as low efficiency of energy conversion. Meanwhile, it can be taken into account, in the case of an advance wave type ultrasonic wave linear motor, that a linear oscillatory body is installed instead of an annular or disc-shaped oscillatory body 116 so as to transmit the oscillation to a driven body by applying the advance wave thereto, but it may involve, in this case, such drawbacks as increasing the energy loss to deteriorate the concerned efficiency because of excitation of advance wave required on the total length of a rail.

SUMMARY OF THE INVENTION

In order to solve such a task as stated above, the present invention proposes an ultrasonic wave linear motor constituted in such a way that an oscillatory element for making oscillation in a direction crossing the shaft line of an oscillatory member is attached to the oscillatory member made of an elastic body formed in a rod shape and a driven body capable of making free relative movement in a direction crossing the shaft line in relation to the above oscillatory member is arranged to abut the end of the above oscillatory member, and also proposes such a driving process that, the ultrasonic wave linear motor makes linear movement by exciting flexural oscillation and longitudinal oscillation on the above oscillatory member by means of the oscillation of an oscillatory element so that an elliptical oscillation composed of flexural oscillation and longitudinal oscillation may take place on the surface of the oscillatory member in contact with the driven body. The present invention also proposes a process for driving the oscillation frequency of the oscillatory element by means of the resonance frequency of the oscillatory member as the most efficient driving process in view of energy.

It is an object of the present invention to provide an ultrasonic wave linear motor characterized in that;

an oscillatory element is attached to one end of an oscillatory member formed in an elastic body of a rod shape and both longitudinal and deflective oscillation are generated on the other end of the oscillatory member by means of the oscillatory element.

It is another object of the present invention to provide an ultrasonic wave linear motor characterized in that;

an oscillatory element which makes oscillation in a direction for crossing the shaft line of an oscillatory member, is attached to the oscillatory member formed in an elastic body of a rod shape and a driven body capable of making free movement relatively to the above-mentioned oscillatory member is brought in contact with one end of the above oscillatory member.

It is a further object of the present invention to provide an ultrasonic wave linear motor driving method characterized in that;

an oscillatory element which makes oscillation in a direction for intersecting the shaft line of an oscillatory member is attached to the oscillatory member formed in an elastic body of a rod shape and a driven body capable of making free movement relatively to the above-mentioned oscillatory member is brought in contact with one end of the above oscillatory member, both deflective and longitudinal oscillations are excited on the above oscillatory member by means of the above-mentioned oscillatory element so as to generate an elliptical oscillation produced by combining the deflective oscillation with the longitudinal oscillation on a contact face between the oscillatory member and the driven body.

It is a still further object of the present invention to provide an ultrasonic wave linear motor characterized in that;

a pair of oscillatory element which make oscillation in directions having mutually equal angles in relation to one plane including the axial line of an oscillatory member are installed on this oscillatory member formed in a rod shape by using an elastic material on both sides of the above-mentioned one plane, so that a driven body capable of making free movement relatively to the above-mentioned oscillatory member in the direction for intersecting its axial line may be brought in contact with one end of the above oscillatory member.

It is a still another object of the present invention to provide an ultrasonic wave linear motor characterized in provision of the first rod shape part and the second rod shape part formed slantly on the top end of the first rod shape part and being provided with oscillatory bodies making oscillation in respective longitudinal directions of the first and second rod shape parts, and a driven body having its running surface brought in contact with the bottom end surface of the first rod shape part.

It is a yet another object of the present invention to provide an ultrasonic wave linear motor characterized in provision of a one-end opened rectangular oscillatory body comprising a pair of leg parts and a barrel part for coupling those leg parts together on its one end, the first electrode attached to the oscillatory body while holding its left half, the second electrode attached to the oscillatory body while holding its right half and a driven body having its running surface with which the bottom surface of the leg parts are brought in contact.

It is a yet further object of the present invention to provide an ultrasonic wave linear motor characterized in provision of an oscillatory member formed in an elastic body of a rod shape and having a projecting face on one or both ends thereof, an oscillatory element attached slantly to one or both ends of the oscillatory member and making oscillation in the direction for crossing the shaft line of the oscillatory member and a driven body having its running surface with which the above-mentioned projecting face is brought in contact.

It is a yet further object of the present invention to provide an ultrasonic wave linear motor characterized in provision of an oscillatory body made of an elastic material, two pieces of oscillatory element attached slantly on the top end of the oscillatory body while opposing to each other and making oscillation in the direction for crossing this attaching face perpendicularly, and a driven body having its running surface with which the bottom end of the above-mentioned oscillatory body is brought in contact.

It is a yet further object of the present invention to provide an ultrasonic wave linear actuator characterized in provision of a pair of oscillatory piece of a rod shape so composed as capable of being subjected to impression of individual driving voltage as well as making telescopic motion when the driving voltage is impressed thereon and a rail member brought in relatively movable contact with one of the above-mentioned pair of oscillatory piece, and also characterized in that those end faces are brought in tight contact with each other so that the above-mentioned respective oscillatory pieces may have relative inclination.

DETAILED DESCRIPTION OF PREFERRED EMBODIMENTS

In such an ultrasonic wave linear motor and its driving process, the oscillation of one oscillatory element is divided and transmitted into two components, one of which is parallel to and the other of which is perpendicular to the shaft line in relation to the oscillatory body.

Out of these components, one perpendicular to the shaft line gives flexural oscillation to the oscillatory member and the other one parallel to the shaft gives longitudinal oscillation thereto, resulting in giving a stationary wave properly amplified in compliance with the material, configuration and size of the oscillatory member. On the contact surface of the end of the oscillatory member with the driven body, an inclined linear or elliptical oscillation is generated on the most front surface due to mutual phase differences among these oscillations and this oscillation is transmitted to the driven body abutting to one end of the oscillatory member and the driven body or the oscillatory member makes linear movement in one direction.

Embodiments of the present invention shall be described hereunder by referring to drawings.

Figure 1:
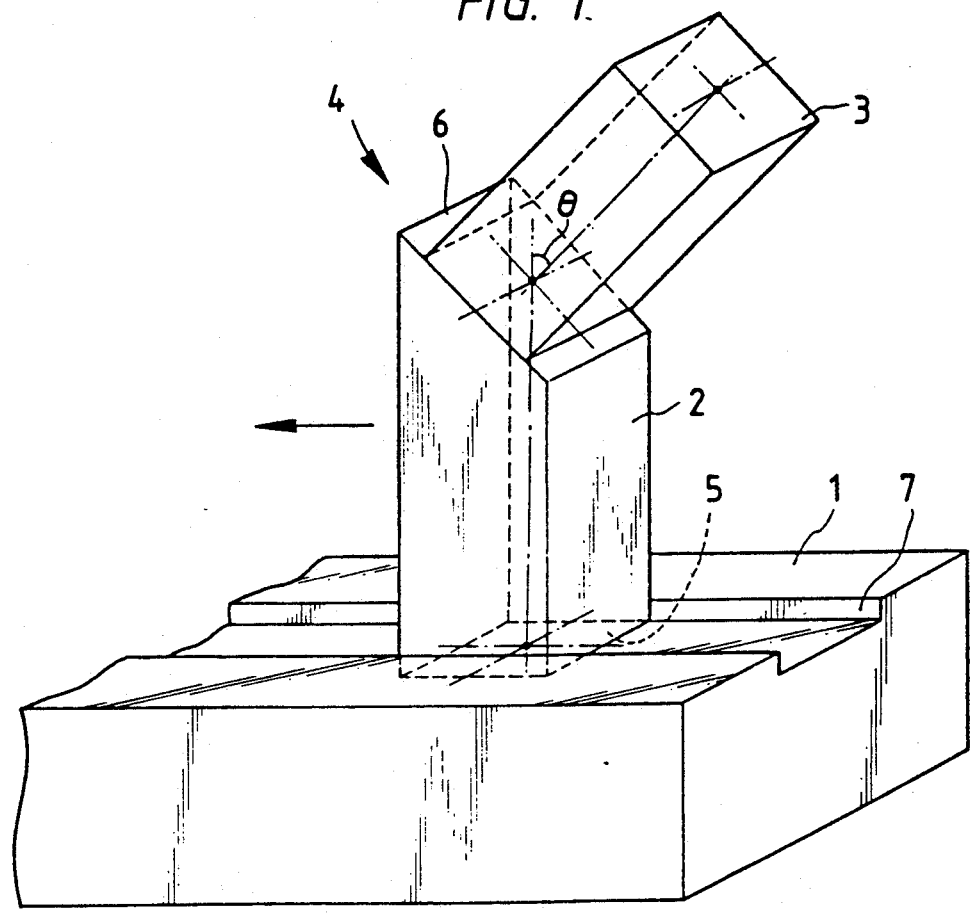
FIG. 1 includes a perspective view for showing one embodiment of the present invention, FIG. 2 includes a cross sectional view for showing another embodiment, FIG. 3 to FIG. 5 include the analytical results of the process of oscillation carried out by a simulation, FIG. 6 displays a graph for showing the relationship between the load and speed of an ultrasonic wave linear motor employed in the embodiment.

FIG. 1 shows one embodiment of the present invention, in which a running body 4 composed of a rod shaped oscillatory member 2 and a longitudinal oscillatory element 3 fixed to the top end of the oscillatory member 2 is movably placed on a smooth rail (driven body) 1.

The above oscillatory member 2 is formed of an elastic material having proper rigidity and elasticity for which a metal such as aluminum is used as a rule, and otherwise, ceramics or resin etc. may be selected as occasion requires. The oscillatory member 2 has a rectangular cross section (square, in the illustrated example), its bottom edge formed in a smooth contact surface 5 perpendicularly intersecting the shaft line and its top edge formed in a slant surface 6 (slant by 45 deg. to the shaft line, in the illustrated example) ascending as advancing in the running direction (direction of rail). Its dimension is to be determined, as stated later, by considering the balancing of a longitudinal oscillation in the axial direction of the oscillatory member 2 caused from excitation by the longitudinal oscillatory element 3 with the flexural oscillation caused from excitation in the direction perpendicularly intersecting the shaft. The longitudinal oscillatory element 3 is fixed to the center of the slant surface 6 by using a bonding agent. This longitudinal oscillatory element 3 is of a well known type which is formed by stacking piezoelectric ceramics plates polarized in their thickness direction while sandwiching electrodes therebetween and applying AC voltage thereon so that it can make longitudinal oscillation.

The oscillatory member 2 of the embodiment illustrated in the figure is made of raw material of aluminum and its dimensions are consisting of 5 mm square cross sectional area, and 12.5 mm height, and the dimensions of the longitudinal element are consisting of 5 mm square cross sectional area, and 9 mm height. It is also allowed to reduce its wear rate so as to attempt smooth running by applying a frictional material consisting of composite material etc. belonging to polyimide system on the contact face of the oscillatory member 2 with a rail 1.

An illustrated example relates to the surface of rail 1 on which a guide groove 7 is formed for regulating the running direction of a running body, but such a guide groove 7 is not necessarily desirable because it increases the friction between the running body 4 and rail 1 resultantly. In addition, the running body 4 is pressed on the rail 1 by its dead weight, but this press-contact force is not sufficient for this purpose as a rule and preferably controlled properly in response to a load or the like. Therefore, it is taken into account, to install closely aside a mechanism for pressing the running body onto the rail at a prescribed pressure as well as to maintain the constant attitude of the running body in relation to the rail.

Figure 2:
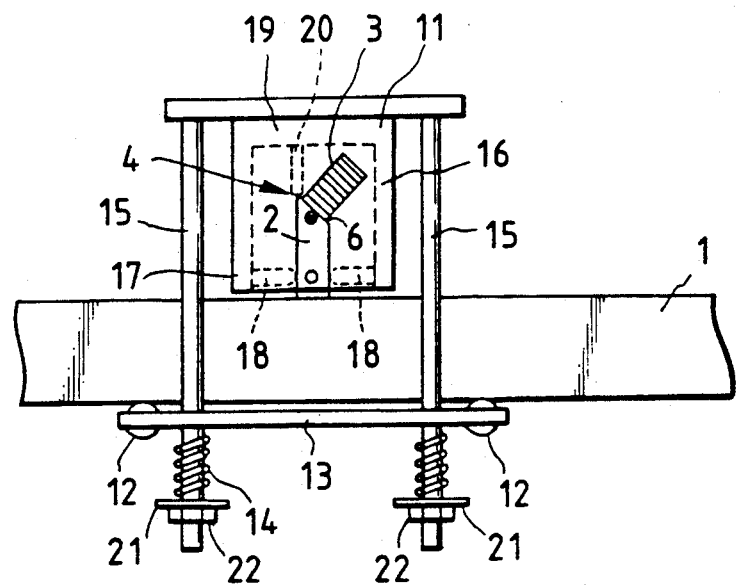
Figure 3A:
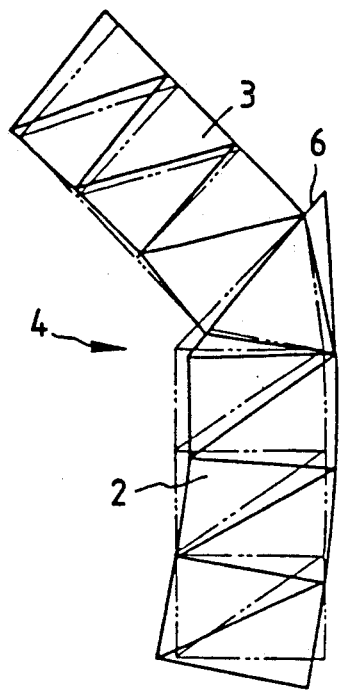
Figure 3B:
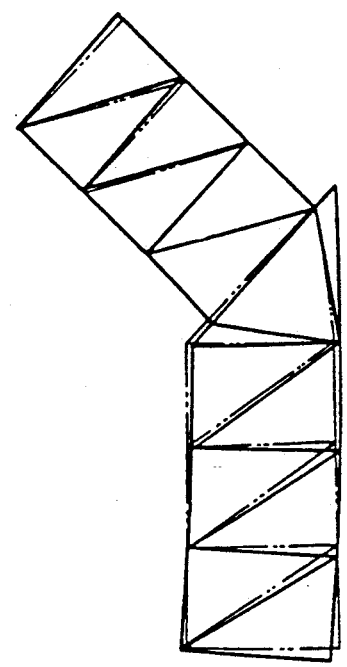
Figure 3C:
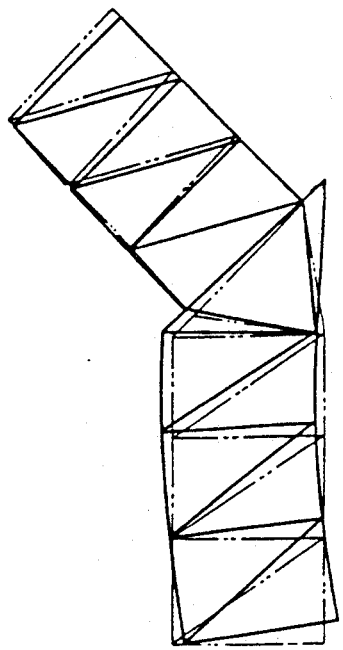
Figure 3D:
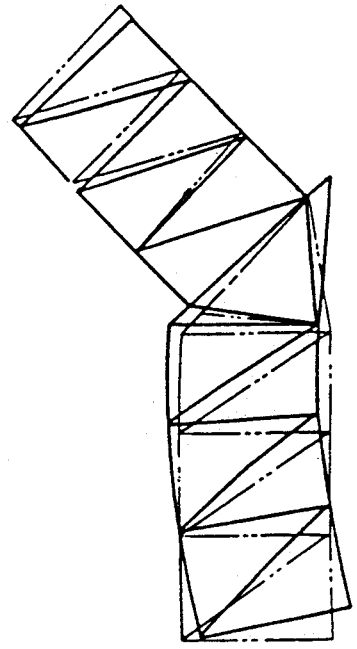

One example of this structure A is shown in FIG. 2. This structure comprises a supporter 11 for surrounding the running body 4, a vehicle frame 13 provided with a pair of front and rear rollers 12 rolling along the lower surface of a rail 1, and connecting members 15 for connecting the above supporter 11 to the vehicle frame 13 via elastic members (coil springs) 14. The above supporter 11 is formed in such a structure as being provided with guide arms 18 for holding the posture of the oscillatory member 2 in contact with four walls of the oscillatory member 2 and also provided with a press-pushing member 20 suspended from the ceiling plate 19 of a box body 16 and press-pushing the oscillatory member 2 from upside so as to hold the running body 4 onto the rail 1 in a fixed posture and support it movably along the rail 1 as well as to protect it. A ball bearing (omitted in the figure) is burried in the tip of each guide arm 18 so as to reduce a frictional resistance against the oscillation of the oscillatory member 2. Also, each connecting member 15 is provided with a nut 22 for adjusting the position of the spring receiver 21 of the coil spring 14, so that the contact surface 5 of the oscillatory member 2 may be press-pushed onto the rail 1 under a fixed pressure by adjusting the energizing power of the coil spring 14 by turning the nut 22.

Then, description shall be stated hereunder in relation to the action of an ultrasonic wave linear motor constructed in such a way as stated above principally based upon the results of FEM (simulation by a computer, using finite element method).

Figure 4:
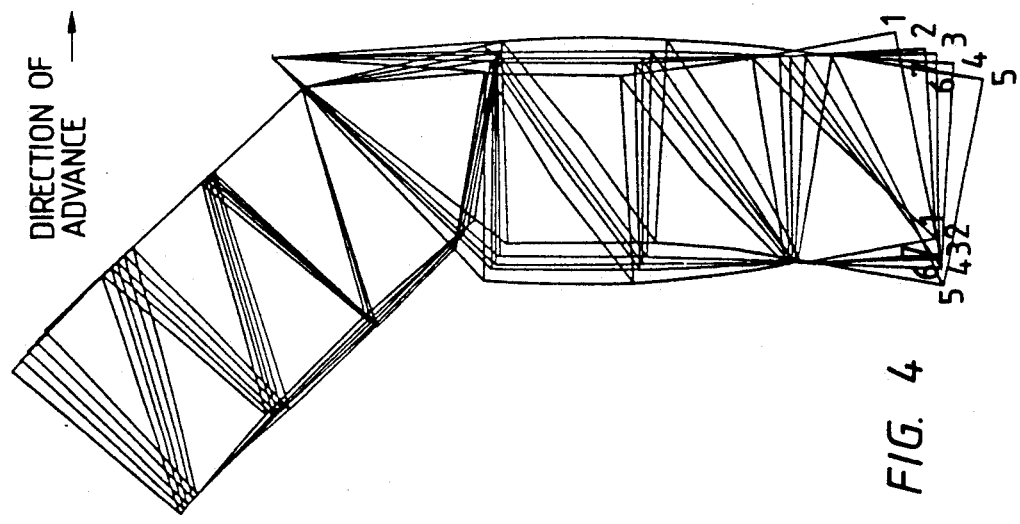

FIG. 3 and FIG. 4 show the results of simulation obtained by applying AC voltage having a resonance frequency close to that of the oscillatory member 2 to a longitudinal oscillatory element 3.

A synthetic oscillation consisting of a longitudinal oscillation and a flexural oscillation is excited by applying AC voltage of a resonance frequency to the longitudinal oscillatory element 3. The oscillatory components are taken into account after being separated from each other and the outline thereof shall be described.

The longitudinal oscillation is of an odd number degree with its node in the center of the oscillatory member 2 and the maximum amplitude on its both ends, while the flexural oscillation is of an even number degree with its nodes in positions equal distances away from the center in opposite directions and its maximum amplitude on its both ends.

FIG. 3(a) to FIG. 3(d) display this process while thin lines in the figures show the original configuration, (a) shows the state of the longitudinal oscillatory element 3 in its most extended state, (b) shows the state of the same element a little contracted from the state shown in item (a), (c) shows its state thereof contracted from its original size, (d) shows its most contracted state and the element returns from the state (d) to the state (a) and repeats this change of state sequentially. Thereby, since the bottom end makes its lateral oscillation simultaneously with its longitudinal oscillation, the bottom end makes an elliptical oscillation as shown in FIG. 4 in form of a resultant oscillation.

This elliptical oscillation is inclined according to a phase difference between the longitudinal oscillation and the flexural oscillation. Also, different oscillations appear on the bottom end of the oscillatory member 2 and at the same time, the configuration of the oscillation also varies depending upon the oscillatory frequency of the longitudinal oscillatory element 3. The flatness of the ellipse is determined principally according to the following two points.

① phase difference between longitudinal oscillation and flexural oscillation

② amplitude difference between longitudinal oscillation and flexural oscillation And differences in these phase and amplitude change depending upon the conditions such as material, dimensions and configuration of the oscillatory member 2 and the dimensions, configuration, weight, material and oscillatory frequency etc. of the longitudinal oscillatory element 3 itself.

Figure 5:
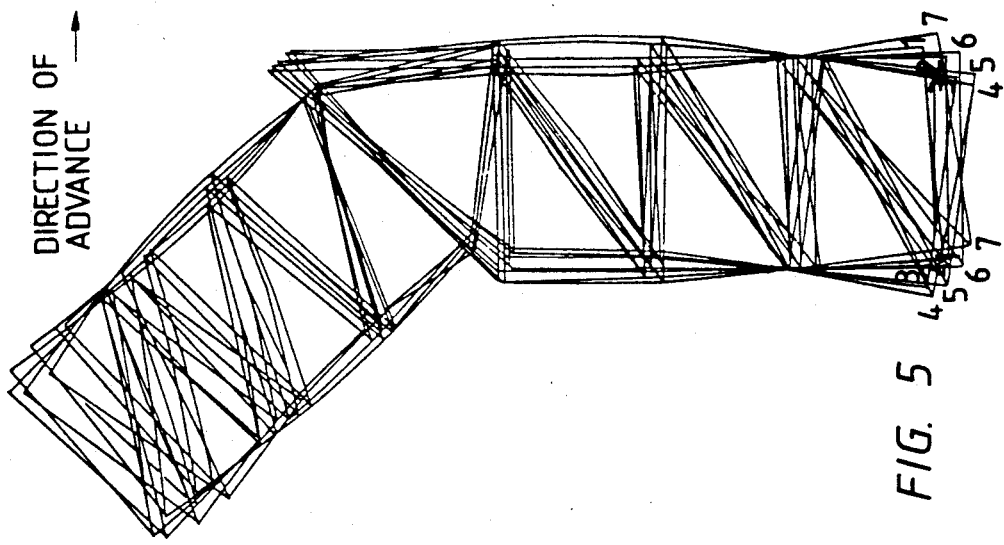

Since the modes of the longitudinal oscillation and the flexural oscillation change, resulting in change of phase difference when the frequency of oscillation is changed, the orientation of the ellipse can be changed. FIG. 5 displays the result of simulation with the oscillatory frequency set to 82.0 KHz and it is known that the linear motor advances in opposite direction when the frequency is 92.7 kHz.

With regard to the material of the oscillatory member 2, the larger the modulus of elasticity is, the smaller the energy loss is, but the displacements by the longitudinal oscillation and flexural oscillation become small. Therefore, the material having the best efficiency of energy is selected from general standpoint of view.

Also in view of the size and configuration, the amplitude of the flexural oscillation increases as the height of the oscillatory member 2 increases, the cross sectional area decreases and becomes flatter in the direction perpendicular to the running direction. Further, the analysis of oscillation is carried out in a structure comprising integrated configuration of the oscillatory member and the oscillatory element.

Embodiment 1

Figure 6:
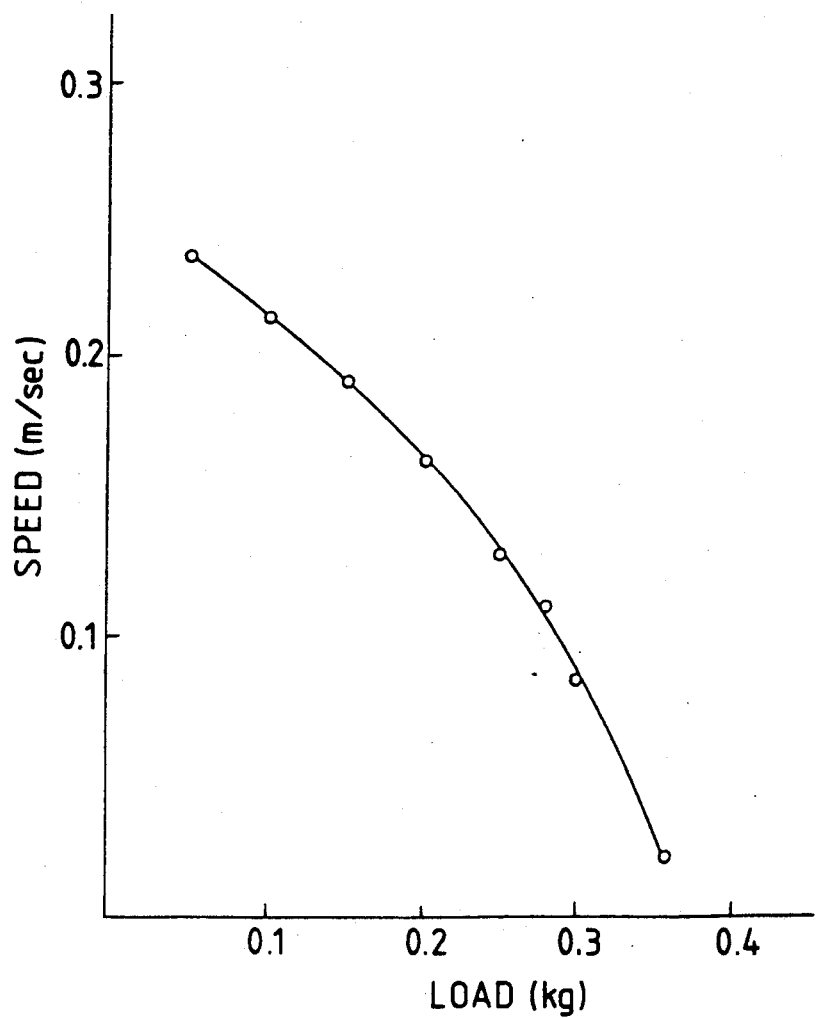
Figure 7:
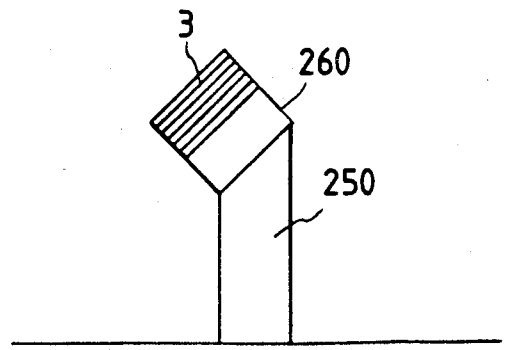
FIG. 7 is a diagram for showing further different embodiment, FIG. 8 includes a perspective view for showing the second embodiment of the present invention, FIG. 9 offers a cross sectional view for showing other example of application.

The relationship between load and speed generated when driving voltage 12V, press-contact force 3 kg and load 0 to 0.3 kg are applied to a longitudinal oscillatory element 3 of the embodiment shown in FIG. 1 is shown in FIG. 6. It was found that the maximum speed and the maximum thrust are 0.4 m/sec and 0.8 kg respectively under no load.

Further, provided that the driving voltage is set to 5.0V between its peaks and press-contact force is set to 0.5 kg, the linear motor runs in the normal direction (direction toward the bottom side of the longitudinal oscillatory element 3) within a range of frequency from 90.0 to 113.0 kHz and runs in the reverse direction within a range thereof from 85.8 to 87.3 kHz. The resonant frequency of this embodiment was 92.7 kHz as the result of analysis through FEM but the results of measurement on practical test model by using an impedance analyzer showed 94.7 kHz.

Meanwhile, the embodiment of the present invention need not be limited to the above-mentioned one but a ratio between a vertical component and a horizontal component of oscillation can be changed by properly setting the slant angle of a slope instead of fixing it to 45 deg. Also, although the cross section is formed in a rectangle, length ratio between adjacent sides can be set conveniently and the cross section can be formed in any shape other than that of a rectangle.

A requirement on an oscillatory member is to have only its local part formed in a rod, e.g. this oscillatory member has such a structure including an inclined part 260 integrally formed on the top end of a rod part 250 and a longitudinal oscillatory element 3 installed on the upper end of the inclined part.

Embodiment 2

Description shall be stated below on the second embodiment of the present invention referring to the appropriate drawings. The same parts and portions as those of the embodiment 1 are given the same symbols.

Figure 8:
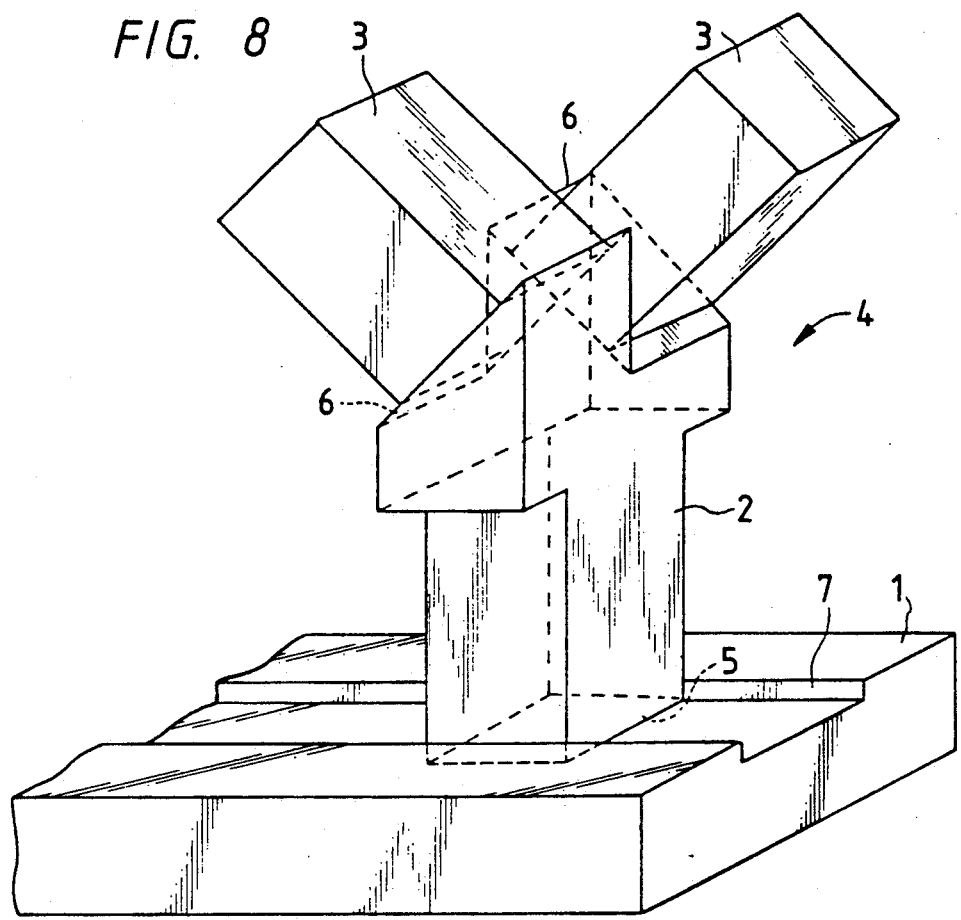

FIG. 8 shows another embodiment of the present invention, in which a running body 4 comprising a circular rod shaped oscillatory member 2 and a pair of longitudinal oscillatory elements 3, 3 fixed on the top end of the oscillatory member 2 is movably placed on a flat and smooth rail (driven body) 1.

The above oscillatory member 2 is formed of an elastic body having proper rigidity and elasticity for which a metal such as aluminum is used but otherwise ceramics, resin etc. may be selected properly for the same purpose. The lower part of the oscillatory member 2 is formed in a rectangle (square in the illustrated embodiment) in its cross section and its bottom end is made a flat and smooth contact surface 5 intersecting perpendicularly the shaft line. Projections extending outward in both directions are formed on its upper area and upper ends of those projections are formed in inclined surfaces 6 inclining to a surface perpendicularly intersecting the running direction (direction of the rail) at respective angles equal in their magnitudes but opposite to each other in view of angular direction (inclination to shaft line is 45 deg. in the illustrated embodiment), with regard to their dimensions, they are determined by taking into account balancing between the longitudinal oscillation caused in the axial direction of the elastic body by excitation of the longitudinal oscillatory element 3 and the flexural oscillation caused by excitation in the direction perpendicularly crossing the shaft as stated later. The longitudinal oscillatory element 3 is fixed to the center of the inclined surface 6 of the oscillatory member 2 by using bonding agent. This longitudinal oscillatory element 3 is a well known one which makes longitudinal oscillation by being laminated with piezoelectric ceramics plates polarized in the direction of thickness with electrodes sandwiched therebetween and given AC voltage applied thereto.

The oscillatory member 2 of the embodiment illustrated in the figure is made of raw material of aluminum and its dimensions are consisting of 5 mm sq. cross sectional area and 12.5 mm height, and the dimensions of the longitudinal oscillatory element 3 are consisting of 5 mm sq. cross sectional area and 9 mm height. It is also allowed to reduce its wear rate so as to attempt smooth running by applying a frictional material consisting of composite material etc. belonging to polyamide system on the contact face of the oscillatory member 2 with a rail 1.

An illustrated example relates to the surface of rail 1 on which a guide groove 7 is formed for regulating the running direction of a running body 4, but such a guide groove 7 is not necessarily desirable because it increases the friction between the running body 4 and rail 1 resultantly. In addition, the running body 4 is pressed on the rail 1 by its dead weight, but this press-contact force is not sufficient for this purpose as a rule and preferably controlled properly in response to a load or the like. Therefore, it is taken into account to install close aside a mechanism for pressing the running body onto the rail at a prescribed pressure as well as to maintain the constant attitude of the running body in relation to the rail.

Figure 9:
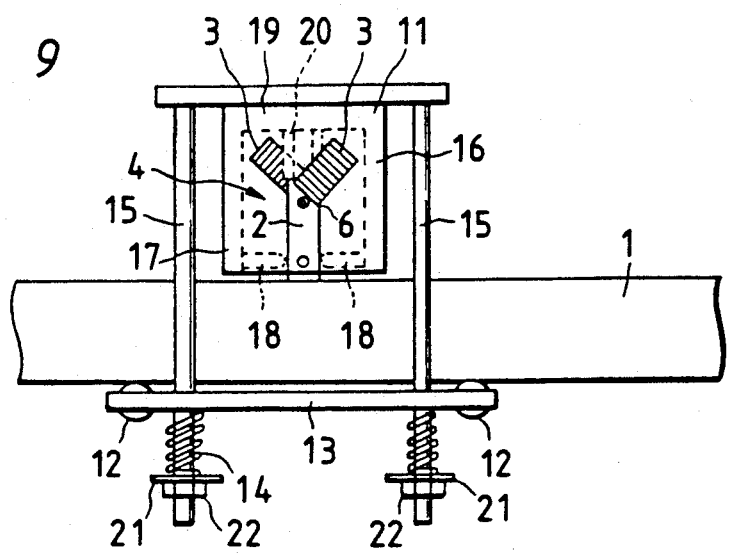

One example of this structure A is shown in FIG. 9. This structure comprises a supporter 11 for surrounding the running body 14, a vehicle frame 13 provided with a pair of front and rear rollers 12 rolling along the lower surface of a rail 1, and connecting member 15 for connecting the above supporter 11 to the vehicle frame 3 via elastic members (coil spring) 14. The above supporter 11 is formed in such a structure as being provided with guide arms 18 for holding the posture of the oscillatory member 2 in contact with four walls of the oscillatory member 2, and also provided with a press-pushing member 20 suspended from the ceiling plate 19 of a box body 19 and press-pushing the oscillatory member 2 from upside so as to hold the running body 4 onto the rail 1 in a fixed posture and support it movably along the rail 1 as well as to protect it. A ball bearing (omitted in the figure) is burried in the tip of each guide arm 18 so as to reduce a friction resistance against the oscillation of the oscillatory member 2. Also, each connecting member 15 is provided with a nut 22 for adjusting the position of the spring receiver of the coil spring 14, so that the contact surface 5 of the oscillatory member 2 may be press-pushed onto the rail 1 under a fixed pressure by adjusting the energizing power of the coil spring 14 by turning the nut 22.

Then, description shall be stated hereunder in relation to the action of an ultrasonic wave linear motor constructed in such a way as stated above.

When AC currents different in respective phases by 90 deg. are applied to a longitudinal oscillatory element, namely sin wave and cos wave are applied thereto, the resultant oscillation is transmitted to the oscillatory member via an inclined surface and its component in parallel to the shaft line of the oscillatory member applies a longitudinal oscillation to the oscillatory member and its component vertical thereto applies a flexural oscillation thereto. These oscillations become stationary wave oscillations in compliance with the oscillatory characteristics of the oscillatory member, namely oscillations having nodes and loops in fixed positions along the axial direction and become composite oscillation consisting of these oscillations on the bottom end of the oscillatory member. If it is assumed for the purpose of simplifying the description that there is no delay of phase between these oscillations and the power supply, the longitudinal and flexural oscillations are expressed in the following equations.

$$X = A(\sin \alpha t + \cos \alpha t)$$

$$Y = B(\sin \alpha t - \cos \alpha t)$$

Accordingly, the oscillation obtained by composing these components together becomes an elliptical oscillation. Practically it becomes an inclined elliptical oscillation on account of delay of phase caused by delay of its phase from that of the power supply and difference in mechanism between longitudinal oscillation and flexural oscillation. In addition, the component oscillations vary on the bottom end of the oscillatory member and display different configurations depending upon the oscillatory frequency of the longitudinal oscillatory element. And differences in phase and differences in amplitude vary depending upon various conditions like material, dimensions and configuration of the oscillatory member 2, and dimensions, configuration, weight and material etc. of the longitudinal oscillatory element 3.

Figure 10:
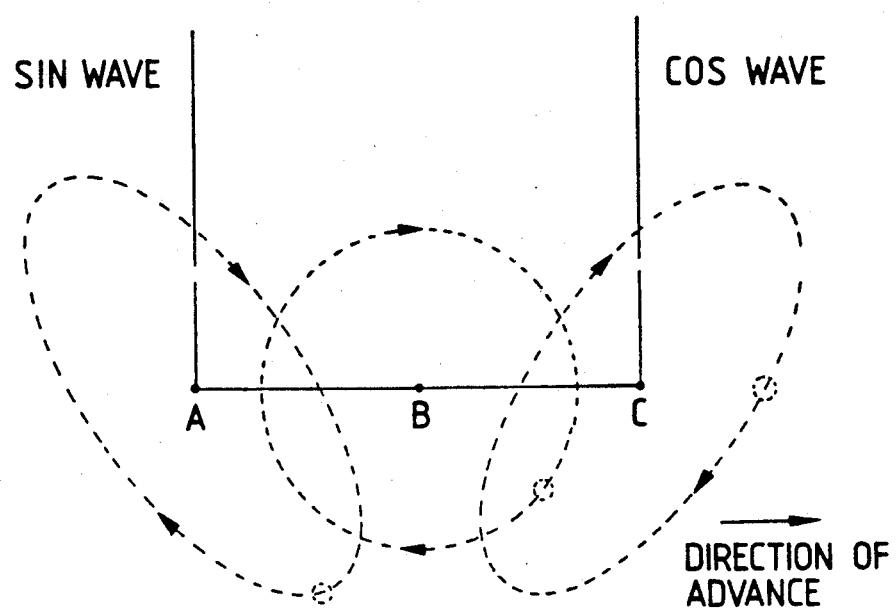
FIG. 10 is a diagram for showing the analytical results of the oscillation in form of a simulation and FIG. 11 includes a graph for showing the relation between the load and speed.

FIG. 10 shows the results of simulation of a free oscillation by means of a computer on the basis of FEM (finite element method), and the oscillatory frequency is set to 92.7 kHz that is the resonant frequency of the oscillatory member 2. According to the above, it is observed that the bottom end of the oscillatory member 2 makes an elliptical oscillation. The running body 4 advances toward the side of the longitudinal oscillatory element 3 to which cos wave is applied.

With regard to the material of the oscillatory member 2, the larger the elastic modulus is, the smaller the energy loss caused by the internal friction, but displacements by the longitudinal and flexural oscillations are reduced, so that a material having the best efficiency of energy in general is to be selected. Also with regard to the dimensions and configuration thereof, the amplitude of the flexural oscillation increases as the height of the oscillatory member increases, its cross sectional area decreases and the shape of the cross section becomes flatter along the direction perpendicular to the running direction. Also, the analysis of oscillation shall be carried out with the oscillatory member constructed in one body with the oscillatory element.

Figure 11:
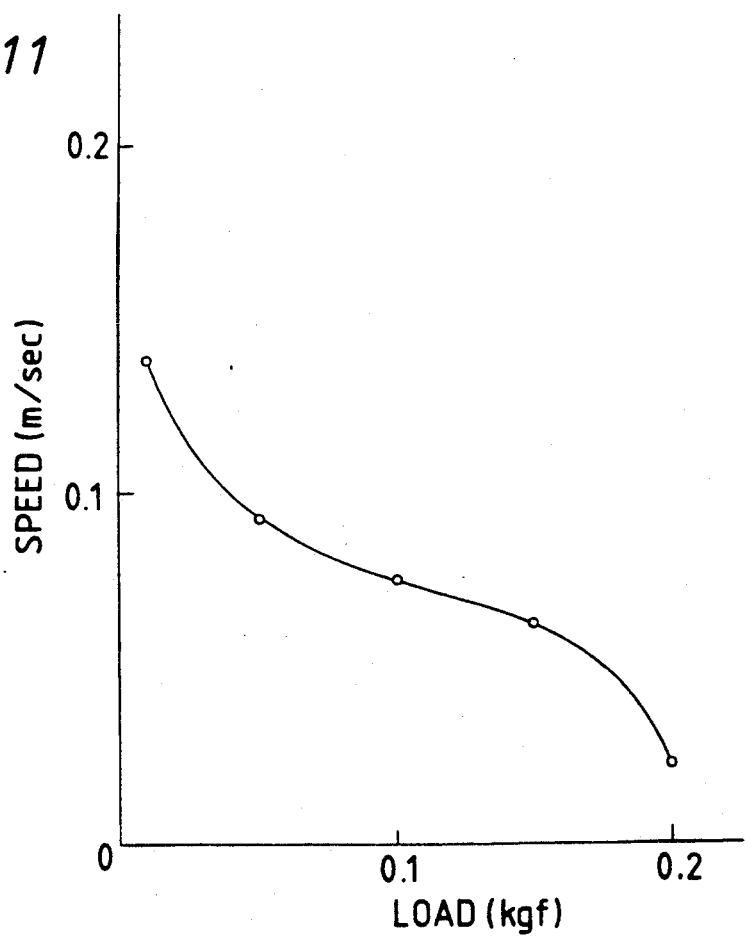

With regard to the running body 4 of the embodiment shown in FIG. 8, the relationship between its load and speed is shown in FIG. 11 for the case when driving voltage 10V between its peaks is applied to the longitudinal oscillatory member 3 under the conditions of driving voltage frequency 90.6 kHz, contact force 3 kg.f and load in a range from 0 to 0.2 kg.f. The maximum speed with no load was 0.2 m/sec. The above-mentioned frequency involves the best efficiency but the running body proved to be practically operatable in a range from 85.0 to 100.0 kHz.

Meanwhile, the embodiment of the present invention need not be limited to the above-mentioned one but a ratio between a vertical component and a horizontal component of oscillation can be changed by properly setting the slant angle of a slope instead of fixing it to 45 deg. Also, although the cross section is formed in a rectangle, length ratio between adjacent sides can be set conveniently and the cross section can be formed in any shape other than that of a rectangle.

Embodiment '

Figure 12:
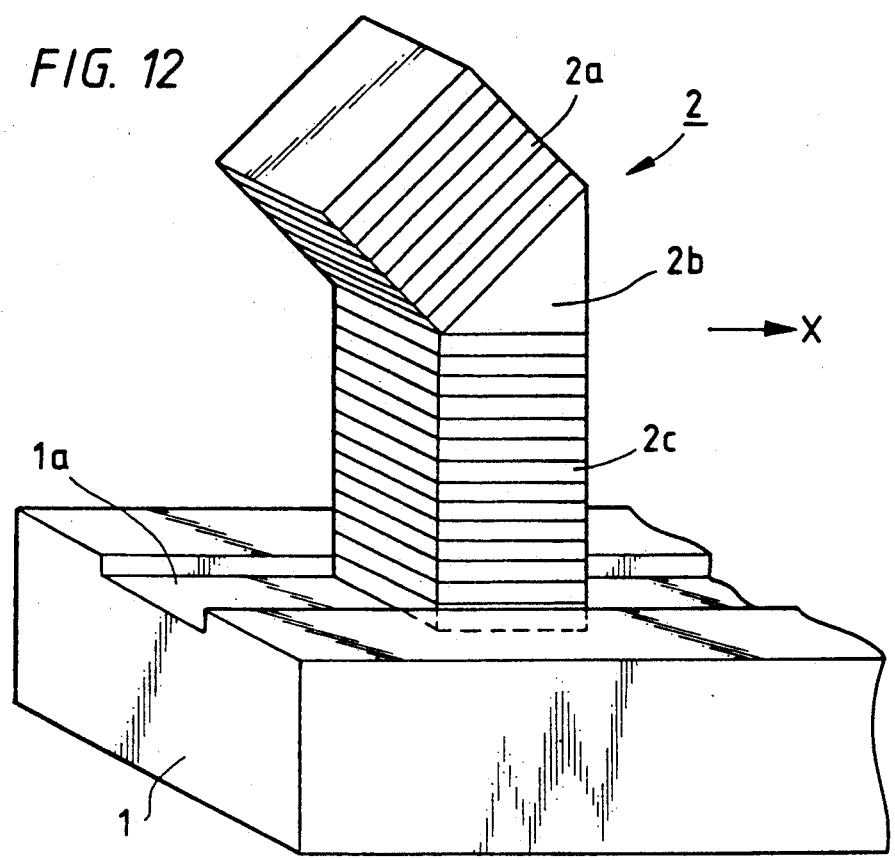
FIG. 12 represents a perspective view for showing the structure of an ultrasonic linear motor relating to the third embodiment of the present invention and FIG. 13 to FIG. 18 include diagrams for showing the analytical results of the oscillatory processes for a running body 2 obtained through a simulation, relating to the third embodiment.

Description shall be stated below on the third embodiment of the present invention referring to the appropriate drawings. FIG. 12 includes a perspective view for showing the structure of an ultrasonic wave linear motor relating to the present invention. Meanwhile, the same parts and portions as those of the preceding embodiments are given the same symbols.

In this figure, symbol 1 represents a flat and smooth rail on the upper surface of which a groove 1a having a prescribed width is formed in its longitudinal direction, and a rod-shaped running body 2 having its head part 2a inclined by a fixed angle is placed on the groove 1a of this rail 1.

The running body 2 comprises the above-mentioned head part 2a, a triangular rod-shaped neck part 2b for inclining the head part 2a, and leg part 2c with its bottom part fitted in the groove 1a. And the head part 2a inclines by 45 deg. for example to the leg part 2c.

Both head part 2a and leg part 2c are respectively formed in each oscillatory element well known by its structure having piezoelectric ceramics plates polarized in the direction of thickness and laminated with electrodes sandwiched therebetween so that it may extend/contract (longitudinal effect) in the direction of lamination by means of AC voltage applied thereto. Furthermore, the neck part 2b is made of the ceramics whose quality is same as that of above-mentioned piezoelectric ceramics plate.

Meanwhile, the running body 2 is formed in one body consisting of two laminated ceramic actuators and ceramic of the same material quality interposed between those actuators, thus its total body serves as an oscillatory element. Its head part 2a, neck part 2b and leg part 2c are joined together by, for instance, bonding agent.

When AC voltage is applied to the head part 2a and leg part 2c of the running body 2 in such a structure, oscillations extending/contracting in longitudinal directions are generated in its head part 2a and leg part 2c respectively. In this case, since the head part 2a is installed on the leg part 2c slantly via the neck part 2b, the oscillation of the head part 2a is divided into a component in parallel to the leg part 2c and a component perpendicularly intersecting the parallel component before being transmitted. Also the oscillation of the leg part 2c amplifies the oscillation of the component in said parallel direction. And as the result of composition of those kinds of operation, an inclined linear or elliptical oscillation is generated on the bottom end surface of the leg part 2c, and this oscillation is transmitted to the rail 1 so that the running body 2 makes straight line motion in one direction.

From now on, the oscillatory process of the above running body 2 shall be described on the basis of an analysis carried out through FEM (simulation by a computer using finite element method).

FIG. 13(a) to FIG. 13(d) include the results of simulation showing the process of oscillations taking place when AC voltage of 98.2542 kHz frequency is applied to the head part 2a and leg part 2c while two-dotted chain lines in the figures display original shapes. Here, let us watch the left bottom part Ps and the right bottom part Pt of the leg part 2c and follow their respective movements.

Figure 14:
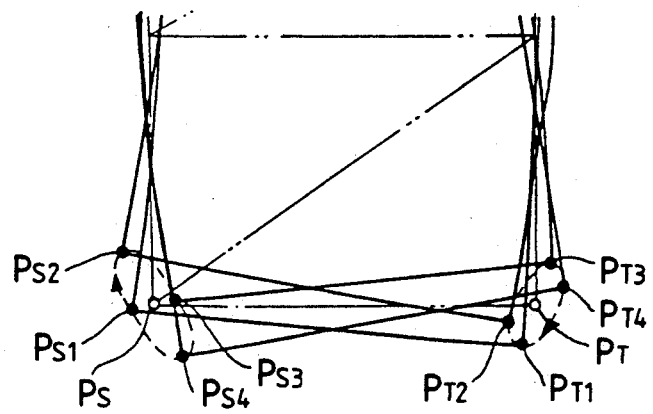

The left bottom part Ps moves to point $Ps_1$ at first, as shown in (a), next to point $Ps_2$ as shown in (b), then to point $Ps_3$ as shown in (c), and to point $Ps_4$ as shown in (d). Then it returns to point $Ps_1$ as shown in (a) and the process of this operation is repeated thereafter. Meanwhile the right bottom part Pt moves to $Pt_1$, $Pt_2$, $Pt_3$, $Pt_4$, and $Pt_1$ in this sequence in the same way as the above case. Composite operations consisting of operations of these bottom parts Ps, Pt are shown FIG. 14. As shown in this figure, the bottom parts Ps, Pt prove to follow the loci of clockwise elliptical oscillations having mutually different phases respectively. And when these elliptical oscillations are transmitted to the rail 1, the running body 2 makes a straight line movement in the direction of arrow mark X as shown in FIG. 1.

Figure 16:
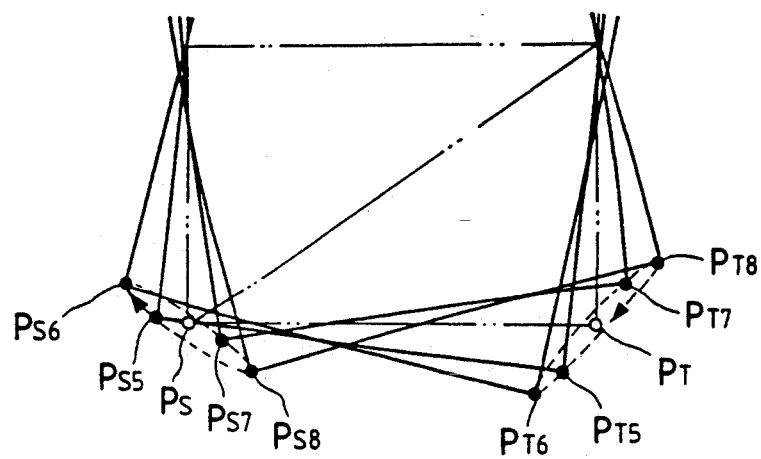

FIG. 15(a) to FIG. 15(d) include the results of simulation showing the process of oscillations taking place when AC voltage of 56.1409 kHz frequency is applied to the head part 2a and leg part 2c, while the left bottom part Ps moves over point $Ps_5$, $Ps_6$, $Ps_7$, $Ps_8$ and $Ps_5$ sequentially in this order and the right bottom part Pt moves over point $Pt_5$, $Pt_6$, $Pt_7$, $Pt_8$ and $Pt_5$ sequentially in this order. And since these composite operations follow the locus of clockwise elliptical oscillations of respectively different phases (refer to FIG. 16), the running body 2 makes a straight line movement in the same direction as stated above (direction of arrow mark X in FIG. 12). Thus, the running body 2 can be advanced in the same direction under different frequencies, thus the range of driving frequency applicable to the running body 2 can be extended widely.

FIG. 17(a) to FIG. 17(d) include the results of simulation showing the process of oscillations taking place when the neck part 26 of the running body 2 is made of aluminum and AC voltage of 106.7438 kHz frequency is applied to the head part 2a and leg part 2c, and the bottom parts Ps, Pt thereof move respectively in the following orders:

Point $Ps_9$, $Ps_{10}$, $Ps_{11}$, $Ps_{12}$ and $Ps_9$ ...

Figure 18:
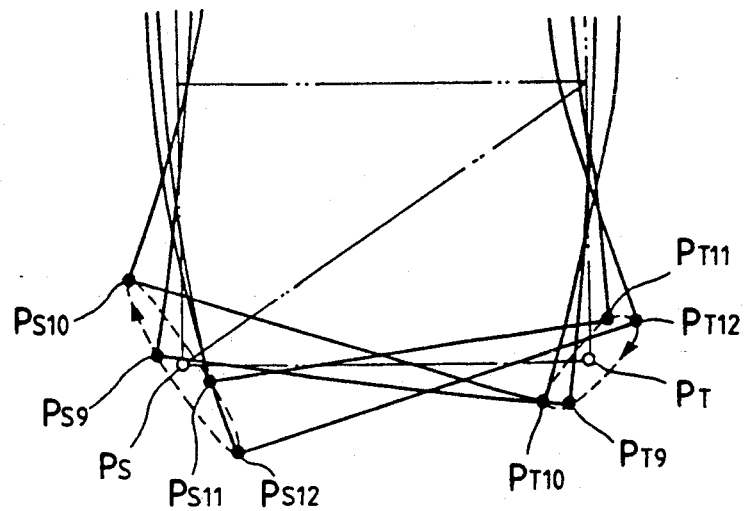

Point $Pt_9$, $Pt_{10}$, $Pt_{11}$, $Pt_{12}$ and $Pt_9$ ...

and follow the loci of clockwise elliptical oscillations having different phases (Refer to FIG. 18). Thus although the aluminum is used for the material of the route between two oscillatory elements, the running body 2 can be guided to make a straight line movement.

Figure 19:
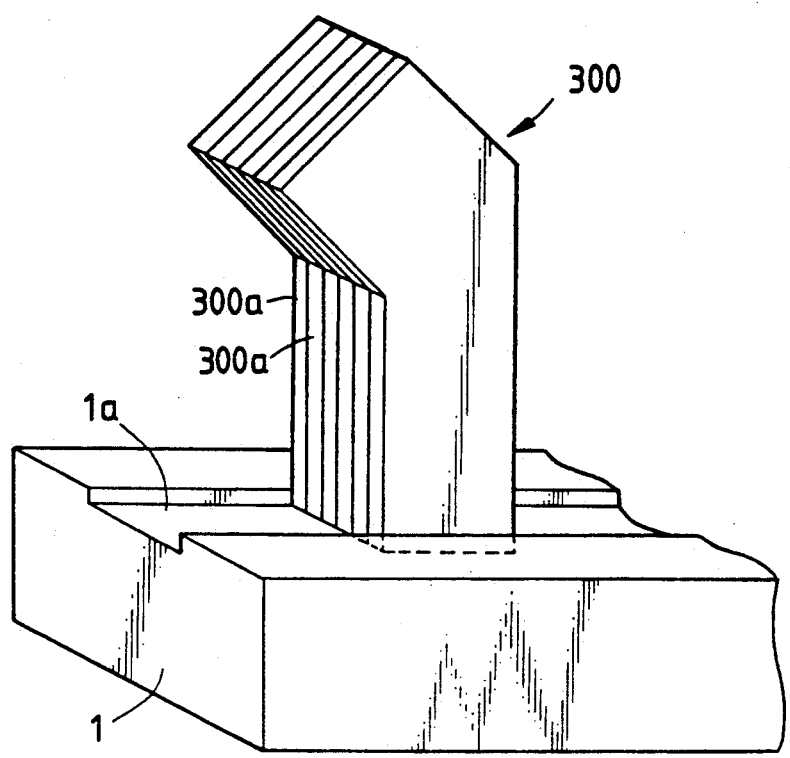
FIG. 19 presents a perspective view for showing the structure of an ultrasonic wave linear motor relating to one example of application of the present invention.

Next the FIG. 19 includes a perspective view for showing the structure of an ultrasonic wave linear motor relating to an embodiment of the present invention. A running body 300 shown in this figure represents a running body formed in a shape similar to that of the running body 2 by laminating, in the direction of width of plates, piezoelectric ceramics plates 500a and 300a having side surfaces formed in the shape of the running body 2 with electrodes sandwiched therebetween while the piezoelectric ceramics plate 300a is arranged to extend/contract in its longitudinal direction (lateral effect). Since the piezoelectric ceramics plate 300a, 300a extending/contracting in its longitudinal direction are formed in the shape similar to that of the running body 2, that is, the shape with upper part being arranged slant to the lower part, elliptical oscillations take place on the surface of the running body 300 in contact with the rail 1 in the way similar to that in the case of embodiment 1, accordingly a straight line movement is allowed in one direction.

Figure 20:
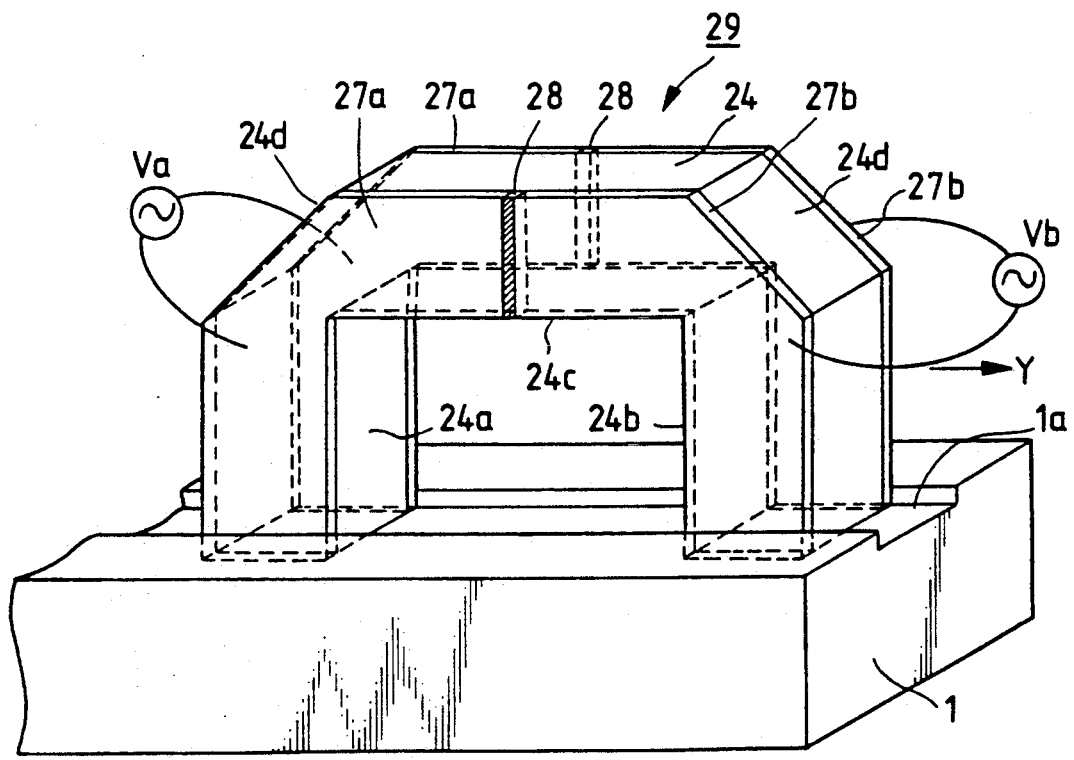
FIG. 20 presents a perspective view for showing the structure of an ultrasonic wave linear motor relating to another example of application of the present invention, FIG. 21 and FIG. 22 include diagrams for showing analytical results of oscillatory processes for a running body 9 obtained through a simulation relating to another example of application.

Then, FIG. 20 includes a perspective view of the structure of an ultrasonic wave linear motor relating to another embodiment to which the present invention is applied. In this figure, symbol 24 represents a piezoelectric ceramics in a shape of one-side-opened rectangle with a square cross section which comprises a pair of legs 24a, 24b, a barrel part 24c for allowing respective one-side ends of leg parts 24a, 24b to be connected to respective both ends thereof and tapered parts 24d, 24d formed by chamfering the leg parts 24a, 24b and barrel part 24c at, for instance, 45 deg. Each electrode of one-side opened rectangular shape consisting of electrodes 27a, 27b and insulator layers 28 for isolating these electrodes 27a, 27b from each other is set on each of both side surfaces of this piezoelectric ceramics 24. In this case, electrodes 27a, 27a face each other by sandwiching the left half of the piezoelectric ceramics 24 and electrodes 27b, 27b face other by sandwiching the right half of the piezoelectric ceramics 24. Also, this piezoelectric ceramics 24 makes extension and contraction in its longitudinal direction (lateral effect). A running body 29 is constructed in this way.

When AC voltages having the same frequency but different phases by 90 deg. from each other are applied to electrodes 27a, 27a and 27b, 27b respectively, oscillations for extending/contracting in the longitudinal direction take place respectively in barrel part 24c and leg parts 24a, 24b. In this case, some oscillation in a slant linear or elliptical shape is generated on the bottom surfaces of leg parts 24a, 24b, because the oscillation of the barrel part 24c causes oscillations which intersect the leg parts 24a, 24b at right angles in the leg parts 24a and 24b respectively. Then, this oscillation is transmitted to the rail 1 so that the running body 29 can make a straight line movement in one direction.

Figure 21A:
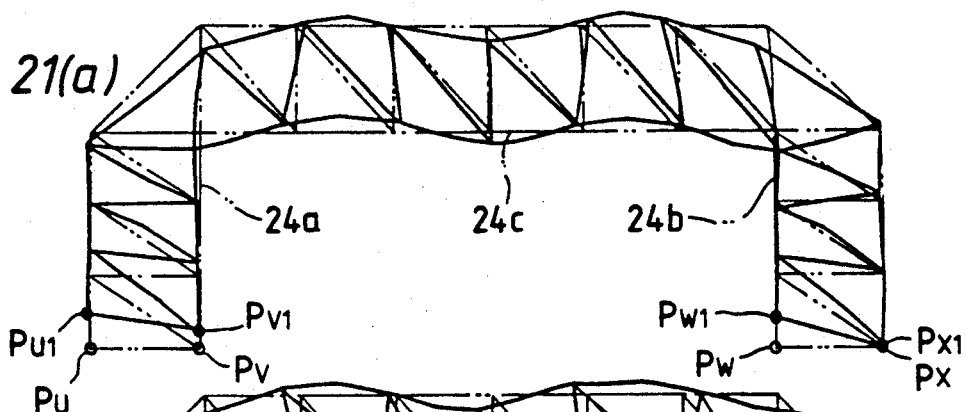
Figure 21B:
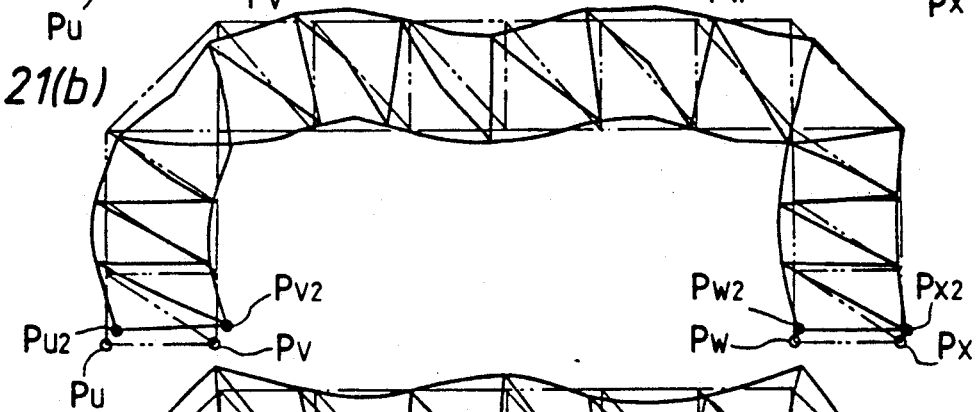
Figure 21C:
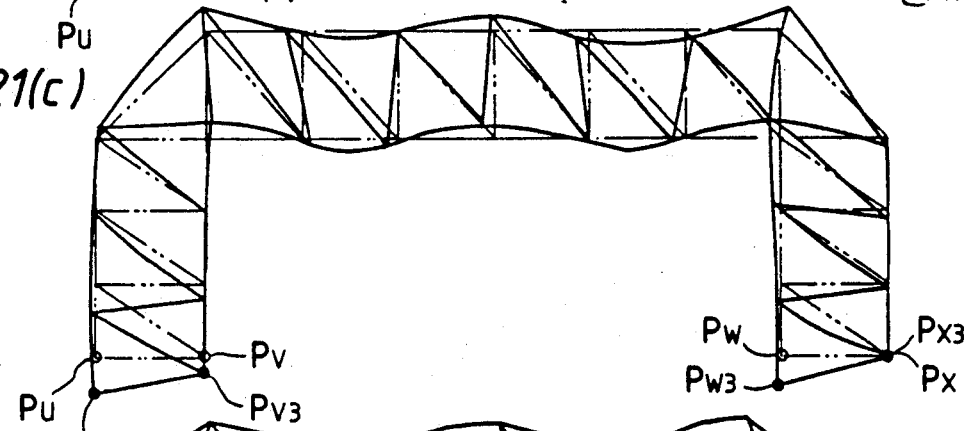
Figure 21D:
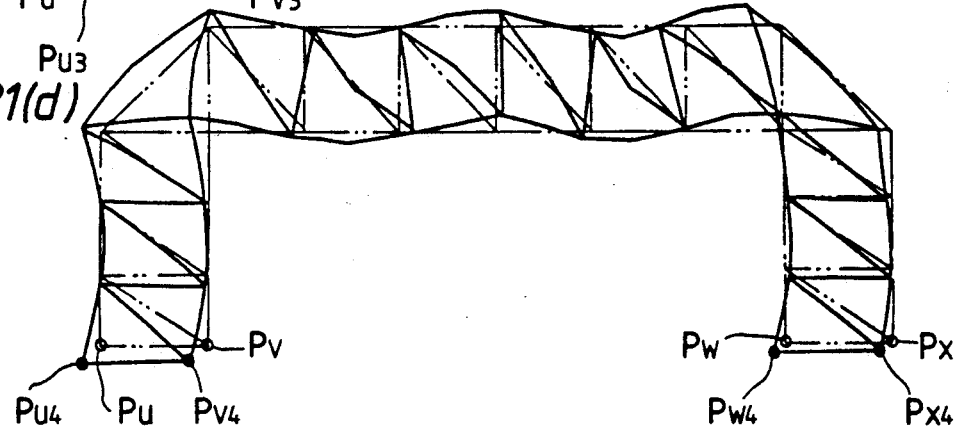
Figure 22:
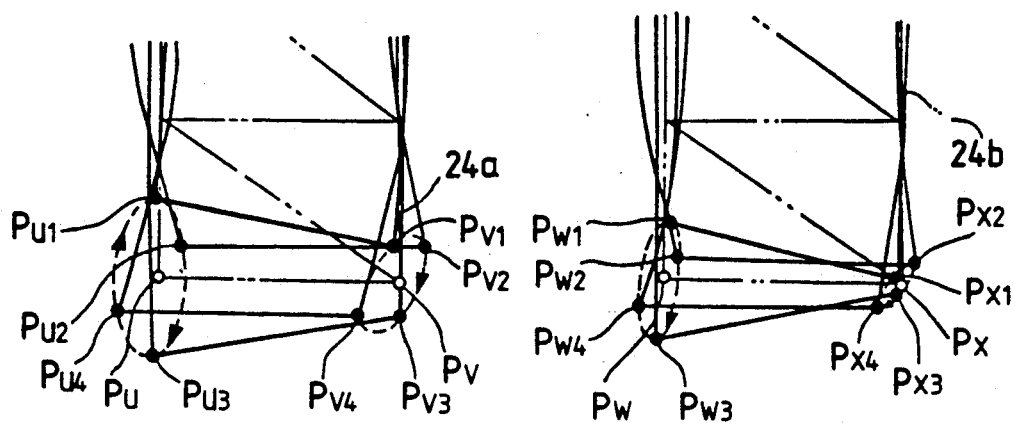

FIG. 21(a) to FIG. 21(b) include the results of simulation showing the process of oscillations taking place when AC voltage expressed by $Va = E \cos \omega t$ is applied to the electrodes 27a, 27a of the running body 29 and AC voltage expressed by $Vb = E \sin \omega t$ is applied to the electrodes 27b, 27b. Meanwhile the frequency of the above AC voltages is 92.621 kHz. Hereat, the bottom end parts Pu, Pv of the leg part 24a and the bottom end parts Pw, Px of the leg part 24b respectively move in the following orders to follow the loci of clockwise elliptical oscillations (Refer to FIG. 22).

. Point $Pu_1, Pu_2, Pu_3, Pu_4, Pu_1, \ldots$
. Point $Pv_1, Pv_2, Pv_3, Pv_4, Pv_1, \ldots$
. Point $Pw_1, Pw_2, Pw_3, Pw_4, Pw_1, \ldots$
. Point $Px_1, Px_2, Px_3, Px_4, Px_1, \ldots$ When these elliptical oscillations are transmitted to the rail, the running body 20 makes a straight line movement in the direction of arrow mark Y.

In the above-mentioned three embodiment, the running body becomes able to make a straight line movement by generating elliptical oscillations on the bottom surfaces of an oscillator by means of the oscillator having both upper part for generating a longitudinal oscillation in a slant or lateral direction and lower part for generating a longitudinal oscillation in a vertical direction. And also this elliptical oscillation includes an effect of high efficiency of energy because the oscillation is processed in form of stationary waves.

Figure 23:
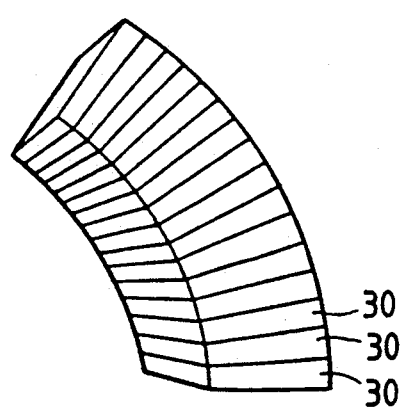
FIG. 23 to FIG. 26 show perspective views for ultrasonic wave linear motors relating to other embodiments of the present invention, FIG. 27 includes a side view for showing the structure of an ultrasonic wave linear motor LM1 relating to the fourth embodiment of the present invention, FIG. 28 includes a side view for showing the structure of an ultrasonic wave linear motor LM2 relating to an embodiment other than the fourth embodiment.
Figure 24:
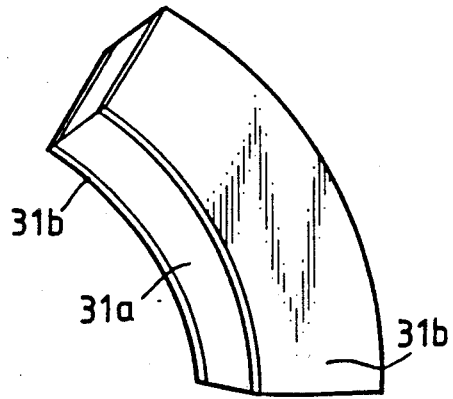

In the above-mentioned embodiments 1 and 2, rod-shaped running bodies, 2, 3 in which the upper part inclines from the lower part at a certain angle are employed, but some other type of running body is also applicable, which is formed, in a head-cut fan shape by laminating wedge-shaped piezoelectric ceramics plates (longitudinal effect) 30 with electrodes sandwiched therebetween as shown in FIG. 23. And it is also allowed to construct the running body by attaching electrodes 31b, 31b respectively on both side surfaces of a head-cut fan shaped piezoelectric ceramics (lateral effect) 31a as shown in FIG. 24.

In the above-mentioned embodiment 3, the running body 29 is constructed by installing two pairs of electrodes 27a, 27a, and 27b, 27b on the left half and the right half of a one-side opened rectangle shaped piezoelectric ceramics 24 so that AC voltages with phases different by 90 deg. from each other may be applied to the left half and the right half of the running body 29 respectively.

Figure 25:
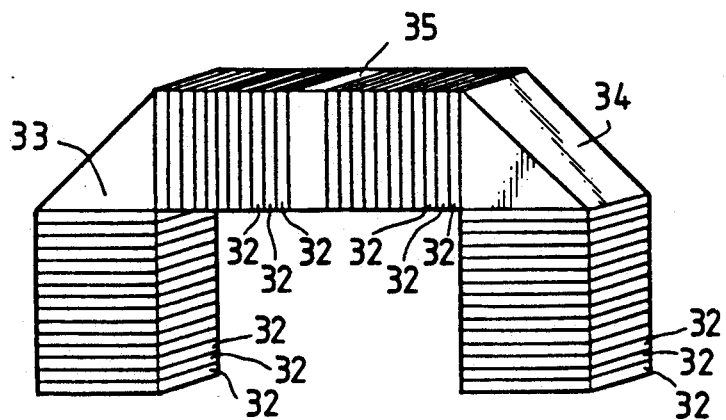
Figure 26:
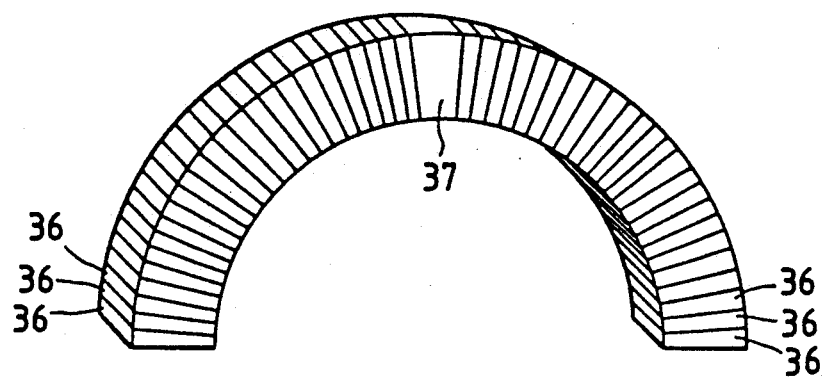

However, it is also allowed, as shown in FIG. 25, to construct a one-side opened rectangular shaped running body by laminating rectangular shaped ceramics plates (longitudinal effect) 32, 32, in its longitudinal direction with electrodes sandwiched therebetween so as to apply AC voltages different by 90 deg. in their phases from each other respectively to the left half and the right half of the running body 29. (Meanwhile, symbols 33, 34, and 35 represent ceramics made of the same material as that of a piezoelectric ceramics plate 2). Or, it is further allowed, as shown in FIG. 26, to construct an arch shaped running body by laminating wedge shaped piezoelectric ceramics plates (longitudinal effect) 36 with electrodes sandwiched therebetween so as to apply AC voltages different by 90 deg. in their phases from each other to the left half and right of the running body. (Here, symbol 37 stands for ceramics having material quality identical to that of the piezoelectric ceramics plate 36.)

Embodiment 4

Figure 27:
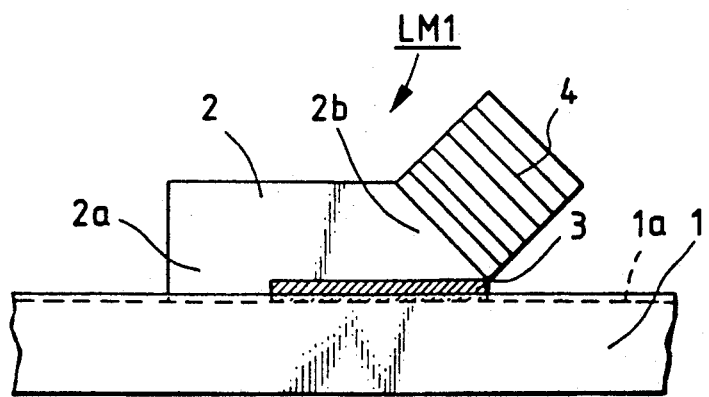

Description shall be stated below on the fourth embodiment of the present invention, referring to the appropriate drawings. FIG. 27 includes a side view for showing the structure of an ultrasonic wave linear motor LM1 relating to the other embodiment of the present invention. Meanwhile, the same parts and portions as those of the above-mentioned embodiments are given the same symbols.

In this figure, symbol 1 represents a flat and smooth rail on the upper surface of which a groove 1a having a prescribed width is formed in its longitudinal direction and an approximately rectangular rod shaped oscillatory member 2 is placed on the upper surface of the groove 1a of the rail 1 with its longitudinal direction kept horizontally.

The oscillatory member 2 is formed of an elastic material having proper rigidity and elasticity, for instance aluminum etc. and a rectangular projection 2a of thickness for instance 1 μm is formed on its left lower part and a tapered part 2b on its right part. The projection 2a is fitted in the groove 1a so that the bottom surface of the projection 2a may come in contact with the upper surface of the groove 1a. In this case, a sliding member 3 having low frictional coefficient is applied to the bottom surface of the oscillatory member 2 except the projection 2a in order to have the bottom surface of the projection 2a brought in parallel contact with the rail 1. The tapered part 2b is formed to make an angle, for instance 45 deg. with the bottom surface of the projection 2a. And, oscillatory elements 4 are mounted on the tapered part 2b by means of bonding agent.

The oscillatory elements 4 are formed in a well known configuration by laminating piezoelectric ceramics plates polarized in the direction of thickness with electrodes sandwiched therebetween and applying AC voltage thereon so that they may extend/contract (longitudinal effect) in the direction for perpendicularly intersecting the surface of installation. An ultrasonic wave linear motor LM1 is constructed in this way.

In such a composition as the above, when an AC voltage with its frequency close to that of the resonance frequency of an oscillatory element 4 is applied to the oscillatory element 4, the longitudinal oscillation of the oscillatory element 4 is divided into a component parallel to the axial direction of the oscillatory member 2 and a component perpendicular thereto to be transmitted to the oscillatory member 2. In this case, the component perpendicular to the shaft line induces a flexural oscillation on the oscillatory member 2 and the component parallel thereto induces a longitudinal oscillation thereon, and these oscillations produce a stationary wave properly amplified in compliance with the material, configuration and dimensions of the oscillatory member 2. Therefore, slantly linear or elliptical oscillations can be generated due to the phase difference among these oscillations on the bottom surface of the projection 2a, namely its surface in contact with the rail 1, and these oscillations are transmitted to the rail 1 so that the ultrasonic wave linear motor LM1 may make a straight line movement in one direction.

Figure 28:
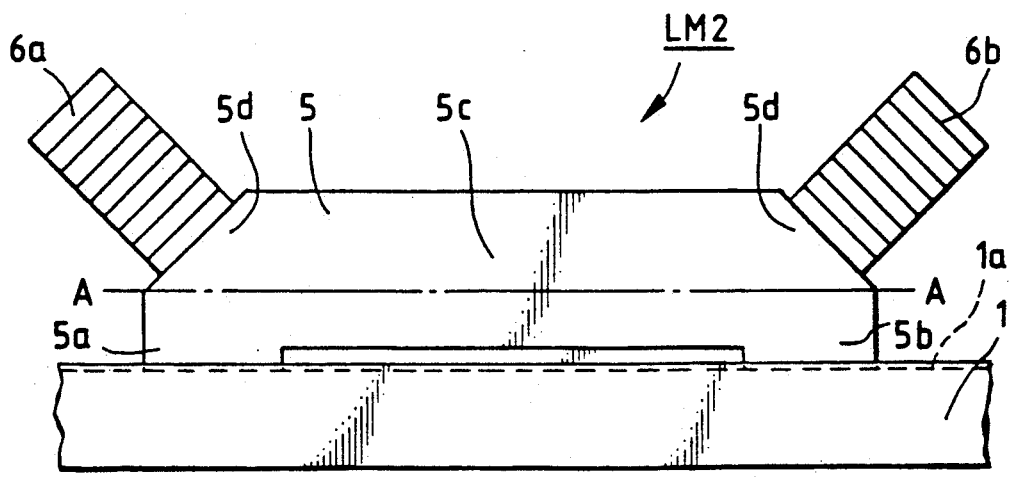
Figure 29A:
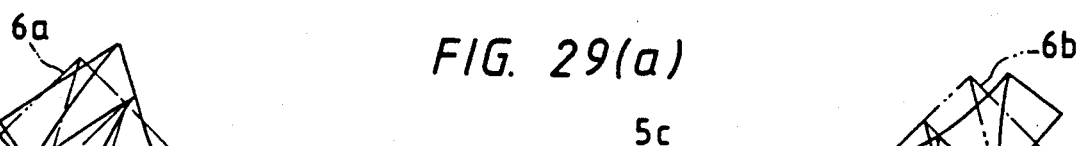
FIG. 29 to FIG. 33 present diagrams for showing the analytical results of oscillatory processes for the beam part 5c of an ultrasonic wave linear motor LM2 obtained through a simulation, FIG. 34 and FIG. 35 include diagrams for showing the results of measurement on the orientation of ellipses on the beam part 5c of an ultrasonic wave linear motor LM2.
Figure 29B:
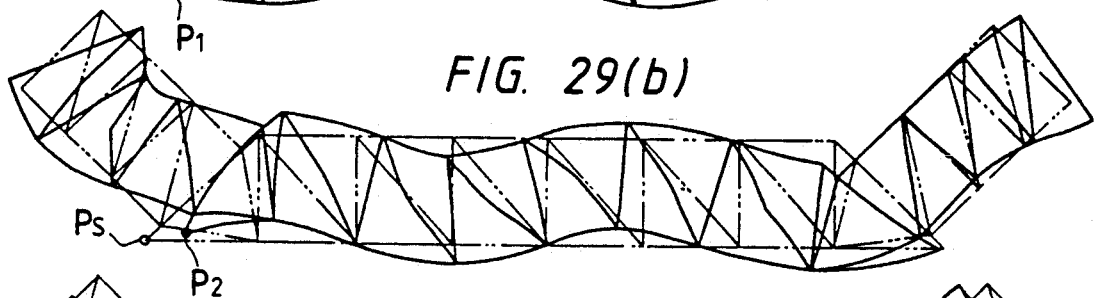
Figure 29C:
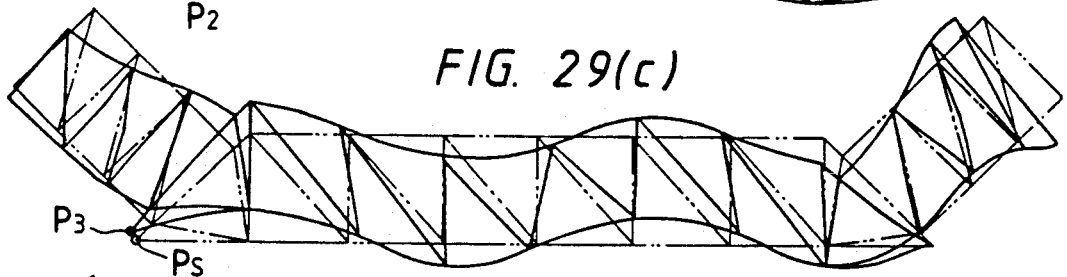
Figure 29D:
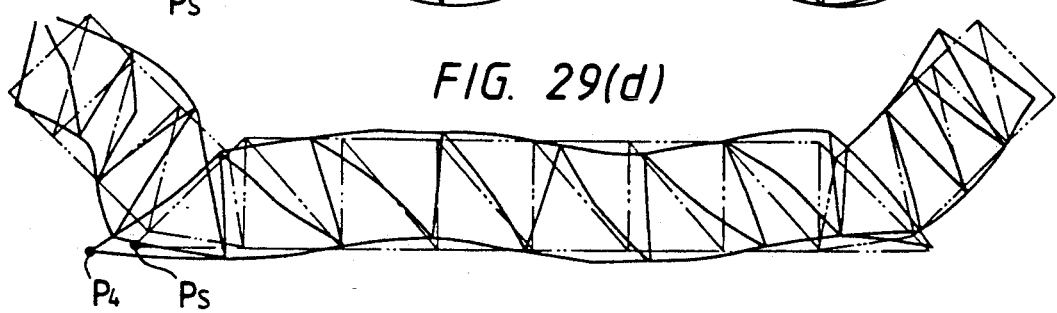

Next, FIG. 28 presents a side view for showing an ultrasonic wave linear motor LM2 relating to an embodiment to which the present invention is applied. In this figure, symbol 5 represents an oscillatory member formed in an approximately rectangular rod shape made of an elastic material such as aluminum, and rectangular shaped projections 5a, 5b of thickness, for instance, 1 μm are formed on the lower sides of both ends of the oscillatory member 5. And the lower surfaces of the projections 5a, 5b are fitted in the groove 1a of the rail 1. And also, the portion for connecting together respective one-side ends of the projections 5a, 5b is called a beam part 5c. Further, on both end upper parts, tapered parts 5d, 5d are formed so that they hold an angle, for instance, of 45 deg., in relation to the projections 5a, 5b and the beam part 5c. And further, oscillatory elements 6a, 6b similar to aforesaid oscillatory element 4 are installed on the tapered part 5d, 5d respectively. The ultrasonic wave linear motor LM2 is constructed in this way.

Then, description shall be stated hereunder, in relation to the action of the beam part 5c of the oscillatory member 5 in the above-mentioned ultrasonic wave linear motor LM2 based upon the results of FEM (Simulation by a computer, using finite element method).

FIG. 29 shows the results of simulation when AC voltage expressed by $Va = E\cos \omega t$ is applied to an oscillatory element 6a and AC voltage expressed by $Vb = E\sin \omega t$ is applied to an oscillatory element 6b. Hereat, the frequency of each above AC voltage is 111 kHz which is close to the resonance frequency of the oscillatory member 5.

Figure 30:
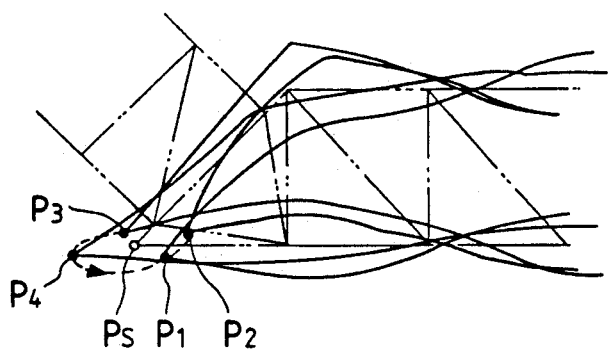

An oscillation composed of a longitudinal oscillation and a flexural oscillation is excited by applying the above-mentioned AC voltage to oscillatory elements 6a, 6b. FIG. 29(a) to FIG. 29(d) display the above process and two-dotted chain lines in the figure display original shapes. Hereat let us watch the left bottom part Ps of the beam part 5c and follow its movement. This part moves to point $P_1$ at first as shown in (a), next to point $P_2$ as shown in (b), then to point $P_3$ as shown in (c), and to point $P_4$ as shown in (d). Then it returns to point $P_1$ shown in (a) and process of this operation is repeated thereafter. The composite operation taking place in this case is shown in FIG. 30. As shown in this figure, it is known that the above operation follows the locus of a counterclockwise elliptical oscillation.

This elliptical oscillation is inclined according to a phase difference between the longitudinal oscillation and the flexural oscillation, and varies in its configuration depending upon the oscillatory frequency applied to the oscillatory elements 6a, 6b as well as follows the different loci of respective oscillations at respective fixed positions on the bottom surface of the beam part 5c. Meanwhile, the flatness of the locus of an elliptical oscillation is determined principally according to the following two points.

① phase difference between longitudinal oscillation and flexural oscillation

② amplitude difference between longitudinal oscillation and flexural oscillation And differences in these phase and amplitude change depending upon the conditions such as material, dimensions, and configuration of the oscillatory member 5, and the dimensions, configuration, weight, material and the oscillatory frequency etc. of the oscillatory elements of oscillatory elements 6a, 6b themselves.

Figure 31:
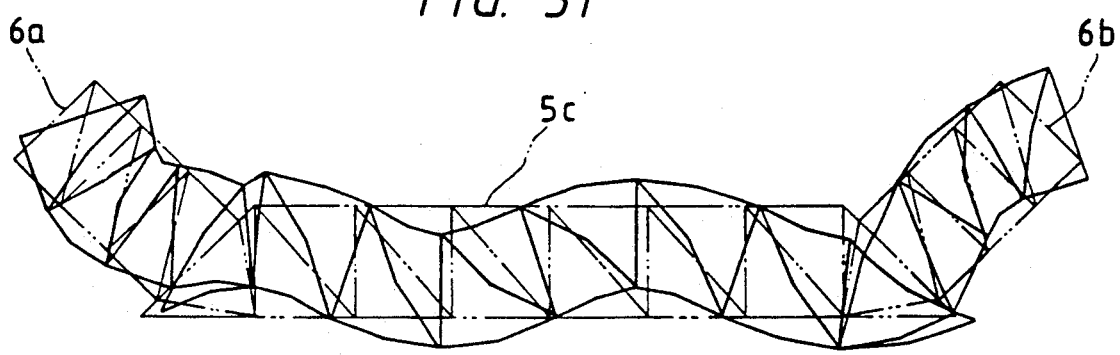

FIG. 31 shows the results of simulation of a free oscillation immediately after stop of application of the above-mentioned respective AC voltages. In this case, the frequency is 111.9 kHz which is the frequency peculiar to the oscillatory member 5.

Figure 32:
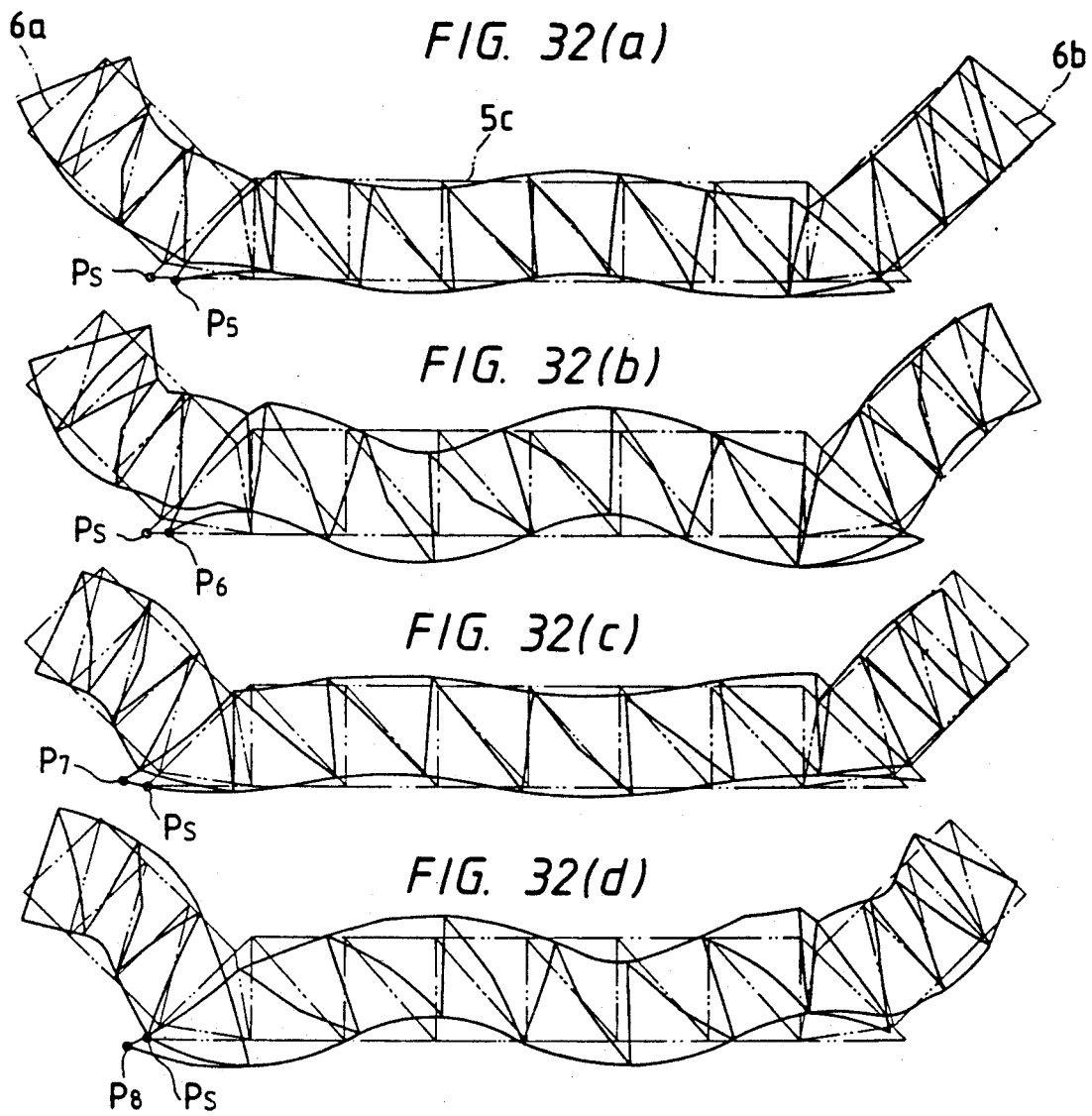

FIG. 32 shows the results of simulation in the case of applying the aforesaid AC voltage expressed by $Vb = E\sin \omega t$ only to an oscillatory element 6b.

Figure 33:
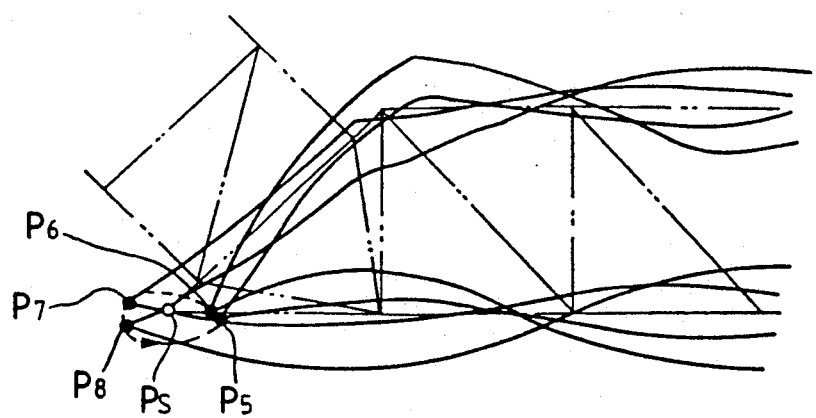

FIG. 32(a) to FIG. 32(b) display the above process and the left end part Ps of the beam part 5c, for example, moves over points $P_5$, $P_6$, $P_7$, $P_8$ in this order and returns to point $P_5$ in the same manner as stated before. Namely, the part $P_2$ follows the locus of a counterclockwise elliptical oscillation, as shown in FIG. 33. Thus, an elliptical oscillation can be generated even in single phase drive.

Figure 34:
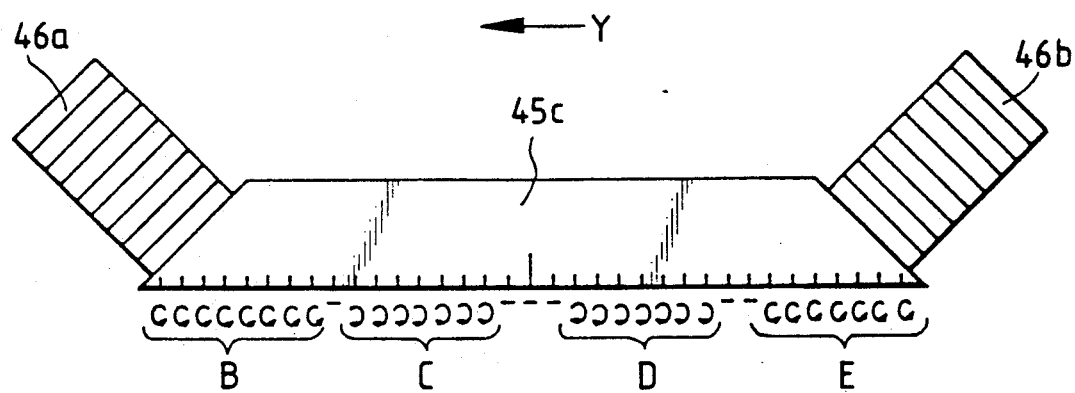
Figure 35:
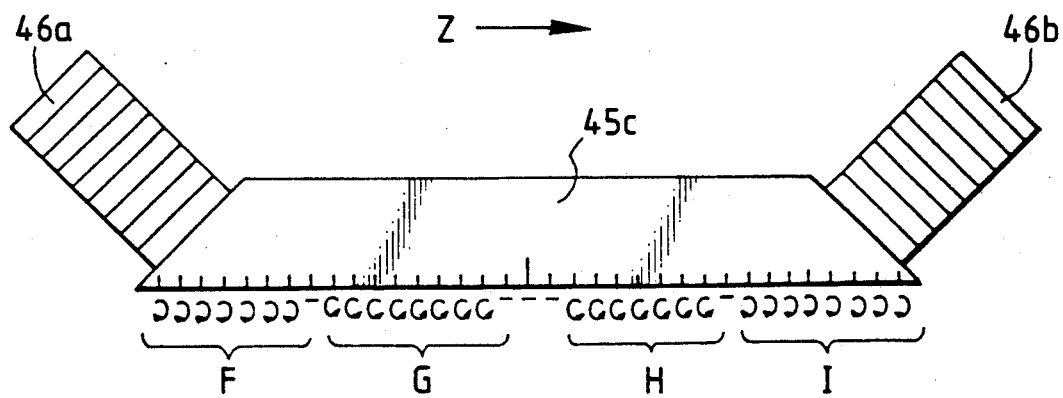

Next, FIG. 34 shows an oscillator formed in a test piece including nothing below A—A line of the oscillator 5 shown in FIG. 28, namely including none of projections 5a, 5b. When AC voltage similar to that applied in the case of simulation shown in the aforesaid FIG. 29, is applied to oscillatory elements 46a, 46b shown in this figure, elliptical oscillations each of which is in the direction shown by each rotational arrow mark are generated on the lower surface of the beam part 45c in positions separated sequently at a fixed interval. The above situation matches the results of simulation shown in FIG. 29 and FIG. 30, wherein the turning direction of elliptical oscillation is counterclockwise in zone B, clockwise in zones C and D, and counterclockwise in zone E. Hereat, drive can be carried out in the direction shown by an arrow mark Y if counterclockwise driving power is taken out by sticking, for instance, a frictional material in the right and left end portions, namely in respective B and E zones to form projecting faces. In other words, driving in one direction becomes available provided that projections 5a, 5b are provided as shown in FIG. 28. Furthermore, FIG. 35 shows the results obtained by exchanging respective voltages applied to oscillatory element 46a and 46b with each other, duly resulting in reversal of turning direction for all elliptical loci. When driving power is taken out from right and left end portions, namely from each zone of F, I, driving can be carried out in the direction shown by arrow mark Z, that is, in the reverse direction.

In the embodiment thus described above, linear movement becomes available because elliptical oscillations are generated on the lower surface of a member in an approximately rectangular rod shape and transmitted to rail 1 via projecting surfaces. In addition, an effect of high efficiency of energy can be expected because these oscillations are given in form of stationary waves.

Embodiment 5

Figure 36:
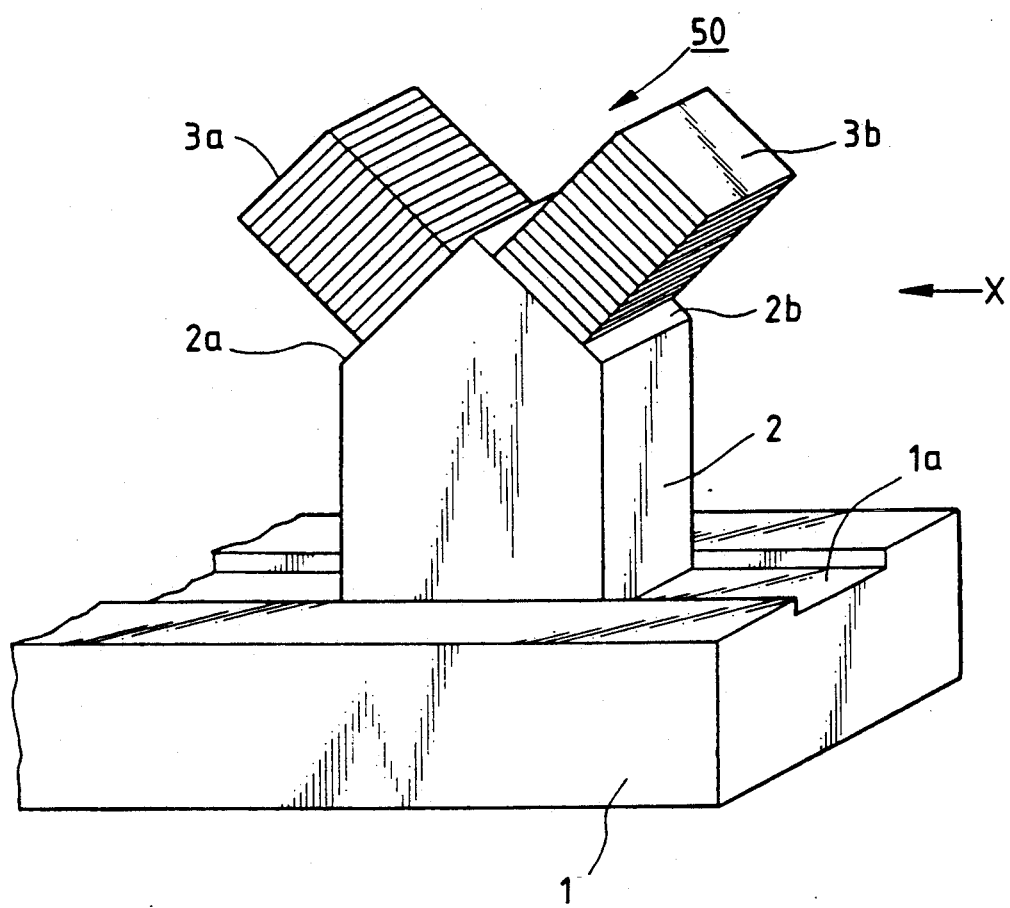
FIG. 36 presents a perspective view for showing the structure of an ultrasonic wave linear motor relating to the fifth embodiment of the present invention.

Description shall be stated below on another embodiment of the present invention, referring to the appropriate drawings. FIG. 36 includes a perspective view for showing the structure of an ultrasonic wave linear motor relating to one embodiment of the present invention. Meanwhile, the same parts and portions as those of the above-mentioned embodiments are given the same symbols. In this figure, symbol 1 represents a flat and smooth rail on the upper surface of which a groove 1a having a prescribed width is formed in its longitudinal direction. And a rectangular rod shaped oscillator 2 of large width is placed on the upper surface of the groove 1a of the rail 1.

The oscillator 2 is formed of an elastic material having proper rigidity and elasticity, for instance, aluminum etc., and tapered parts 2a, 2b are formed on its top. These tapered parts 2a, 2b are chamfered at, for instance, 45 deg. respectively to the lower end of the oscillator fitted in the groove 1a, resulting in its top formed in a triangular prism shape. And oscillatory elements 3a, 3b actuated by a laminated ceramics actuator or the like are attached to the tapered parts 2a, 2b by means of, for example, bonding agent.

And a running body 50 comprises an oscillator 2 having its bottom end fitted in the groove 1a of the rail 1 and two pieces of oscillatory elements 3a, 3b attached slantly to the upper part of this oscillator 2 while facing each other.

In such a structure, when AC voltages having the same frequency but different phases 90 deg. apart from each other are applied to the oscillatory elements 3a, 3b respectively, respective oscillations that make extension/contraction in the directions perpendicularly intersecting the respective installation faces are generated in the above-mentioned respective oscillatory elements 3a, 3b. In this case, since these oscillatory element 3a, 3b are installed on the oscillator 2 slantly to its lower end, oscillations of these oscillatory elements 3a, 3b are divided into respective components parallel to and perpendicular to the oscillator 2 before being transmitted thereto individually. In this case, since the oscillation of the oscillatory element 3a (or oscillatory element 3b) is different from an oscillatory element 4a (or oscillatory element 4b) by 90 deg. in its phase, both components of oscillation transmitted to the oscillator 2 in parallel and perpendicular thereto respectively are amplified. And as the result of composing these components of oscillation, a large inclined linear or elliptical oscillation is generated and transmitted to the rail 1 so that the running body 5 makes linear movement in one direction.

Figure 37A:
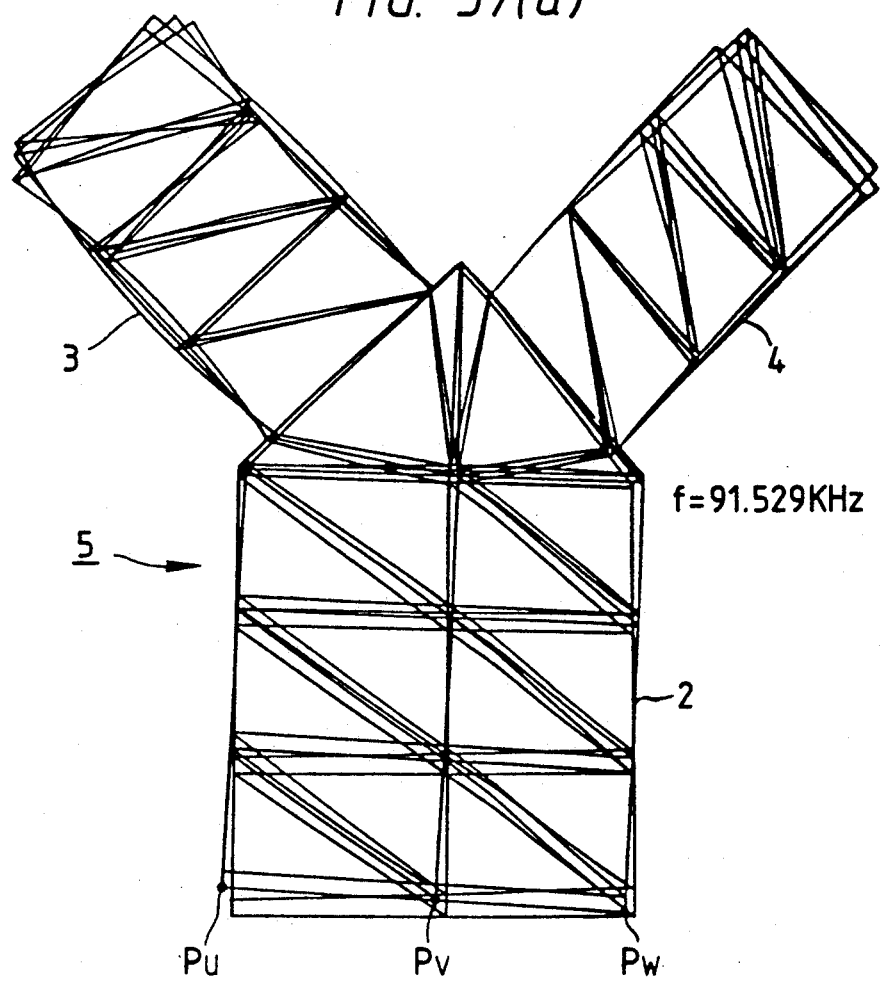
FIG. 37 and FIG. 38 present diagrams for showing the analytical results of the oscillatory processes of a running body 5 obtained through a simulation relating to the present embodiment.
Figure 37B:
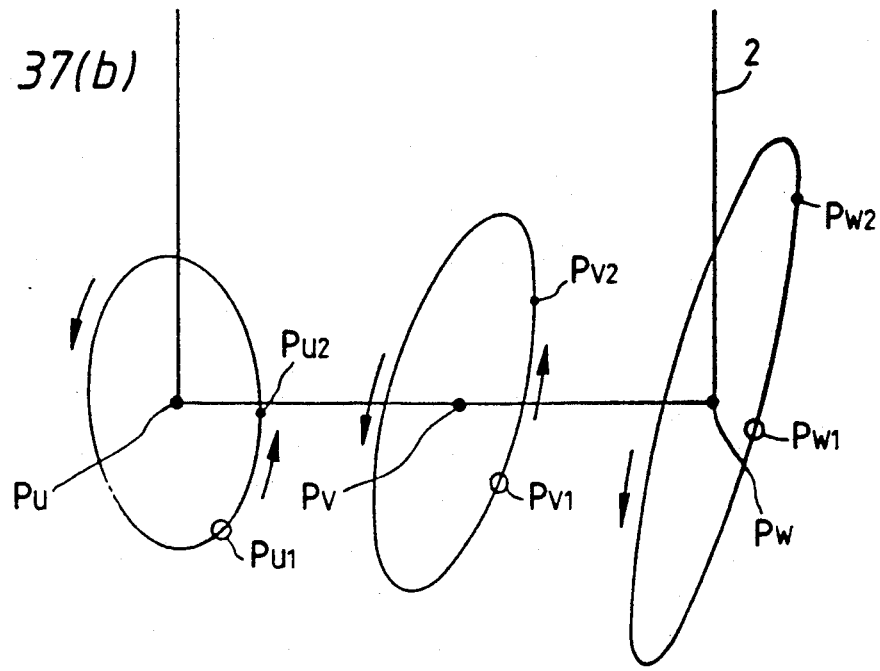

FIG. 37(a) is a diagram for showing the results of FEM (simulation by a computer using finite element method) when AC voltage expressed by $Va = E \sin \omega t$ is applied to the oscillatory element 3 of the abovementioned running body 5 and AC voltage expressed by $Vb = E \cos \omega t$ is applied to the oscillatory element 3a. Meanwhile, the oscillatory frequency of the above respective voltages is 91.529 kHz. Then, the lower end parts Pu, Pv and Pw of the oscillator 2 sequently move respectively as shown in FIG. 37(b).

. Point $Pu_1, Pu_2, \ldots, Pu_1, \ldots$
. Point $Pv_1, Pv_2, \ldots, Pv_1, \ldots$
. Point $Pw_1, Pw_2, \ldots, Pw_1, \ldots$ It is known from the above situation that these points follow the loci of counterclockwise elliptical oscillations having different phases and amplitudes respectively. And when these elliptical oscillations are transmitted to the rail 1, the running body 50 makes a straight line movement in the direction of arrow mark X as shown in FIG. 36.

Figure 38A:
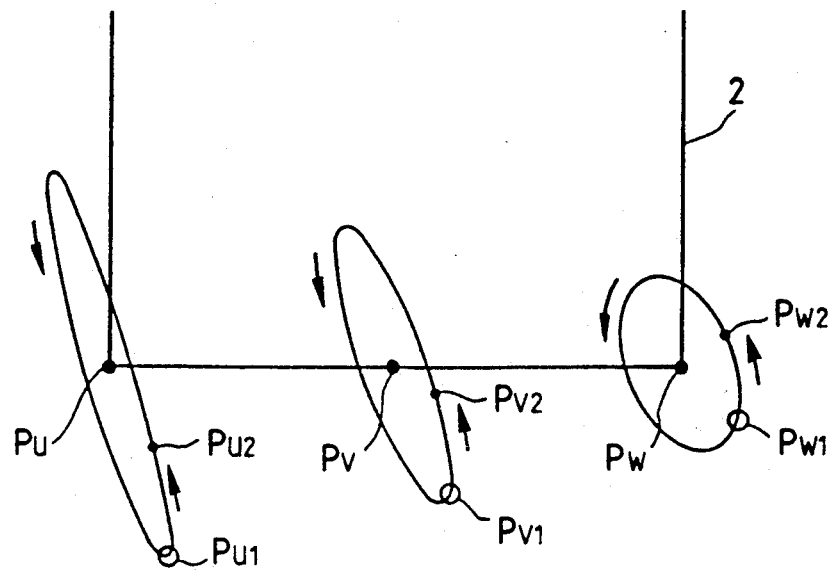
Figure 38B:
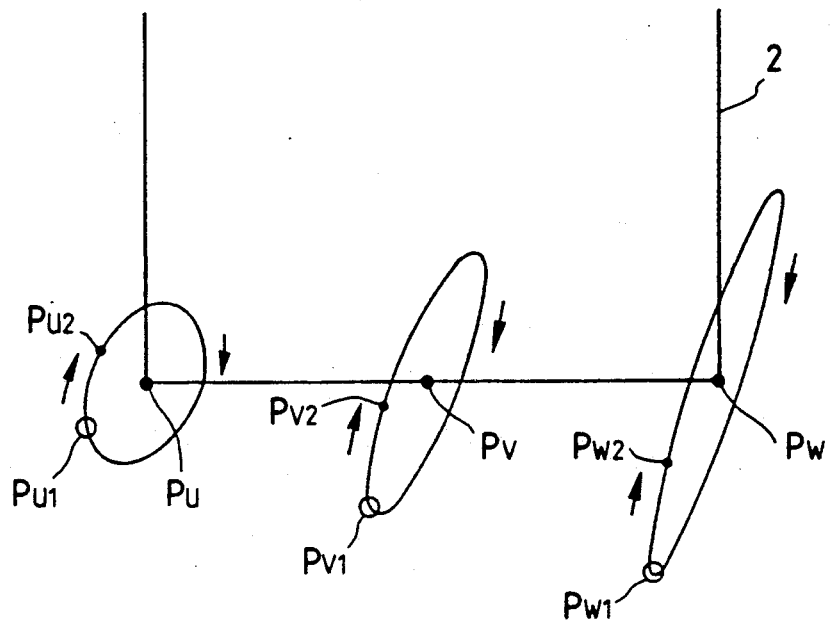
Figure 39:
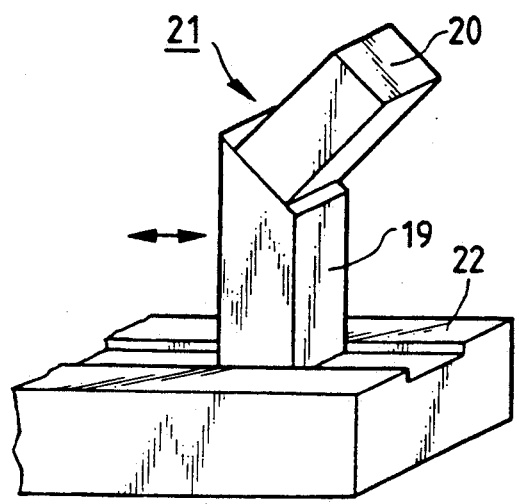

FIG. 38(a) is a diagram for showing the movement of the lower end parts Pu, Pv, and Pw of the oscillator 2 when AC voltage expressed by $Va = E \sin \omega t$ is applied only to the oscillatory element 3a, and respective lower end parts Pu, Pv and Pw follow loci of counterclockwise elliptical oscillations having different values of amplitude. Meanwhile, FIG. 38(b) is a diagram for showing the movement of the lower end parts Pu, Pv and Pw thereof when AC voltage expressed by $Vb = E \cos \omega t$ is applied only to the oscillatory element 3a and respective lower end parts Pu, Pv and Pw follow the loci of clockwise elliptical oscillation perfectly reverse to the elliptical oscillation shown in FIG. 38(a) symmetrically with respect to the central point of the lower end. And when the above-mentioned AC voltages are applied to oscillatory elements 3a, 3b simultaneously, namely, the above two elliptical oscillations are combined together, the locus of a large elliptical oscillation appears as shown in FIG. 37 stated before because the elliptical oscillation shown in FIG. 38(b) has its phase advanced by 90 deg. from the phase of the elliptical oscillation shown in FIG. 38(b).

In the above-mentioned embodiment, since two oscillatory elements are slantly installed, while facing each other, on the upper part of the oscillator 2 so that the oscillation of one side oscillatory element is so arranged as to amplify the parallel and normal components of oscillation transmitted to the oscillator 2 by the other side oscillatory element, a large elliptical oscillation is generated on the lower end surface of the oscillator 2 so that the moving speed of the running body 5 can be increased. Further, since this elliptical oscillation is inform of a stationary wave, effect of high efficiency of energy can be assured.

Embodiment 6

Figure 40:
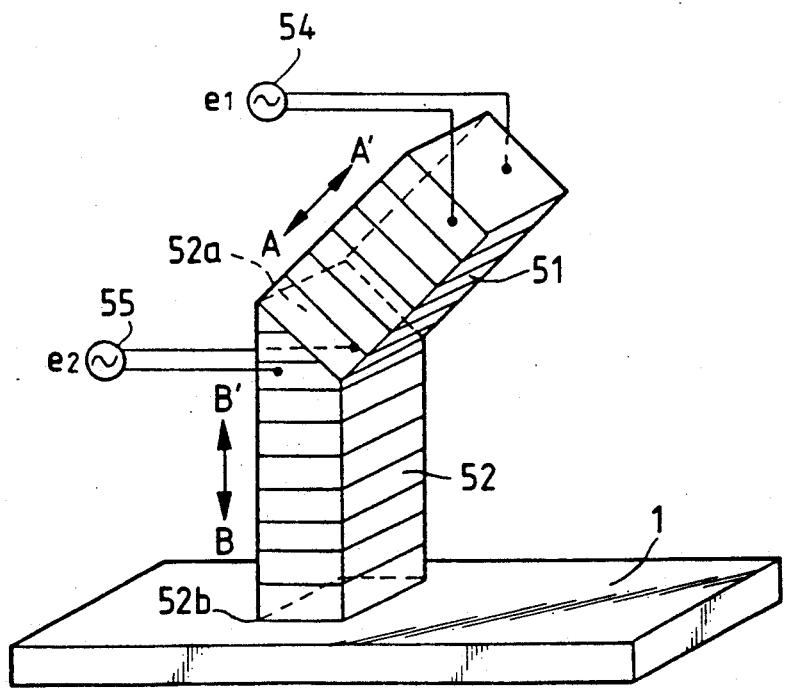
FIG. 40 presents a perspective view for showing the 6th embodiment relating to the present invention, FIG. 41 includes diagrams for showing loci of corner part 52 in FIG. 40.
Figure 41A:
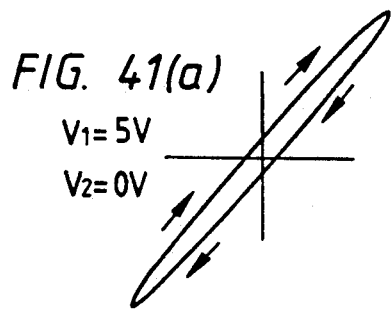
Figure 41B:
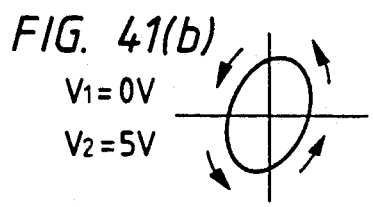
Figure 41C:
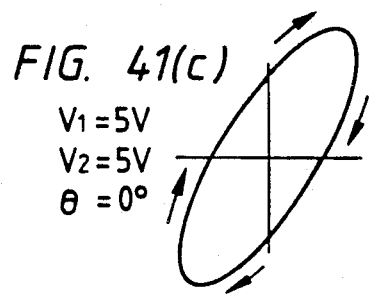
Figure 41D:
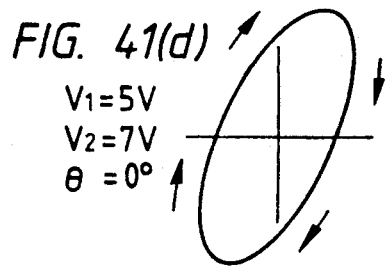
Figure 41E:
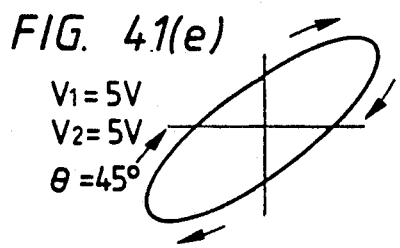
Figure 41F:
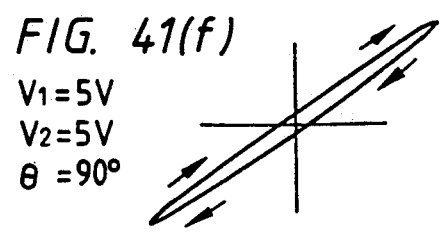
Figure 41G:
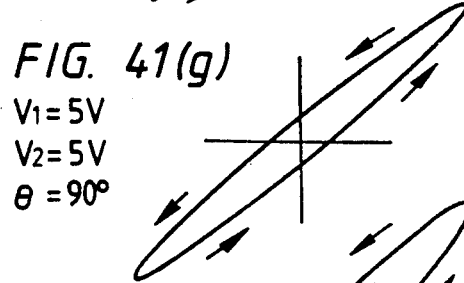
Figure 41H:
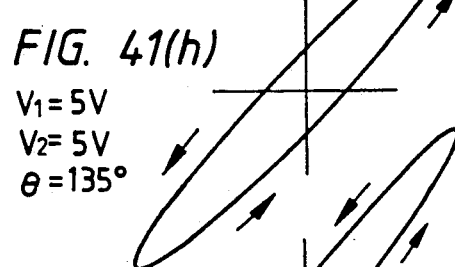
Figure 41I:
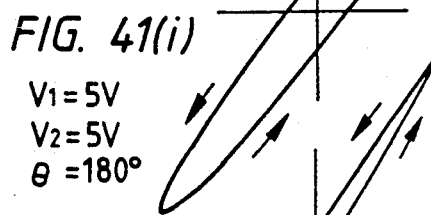
Figure 41J:
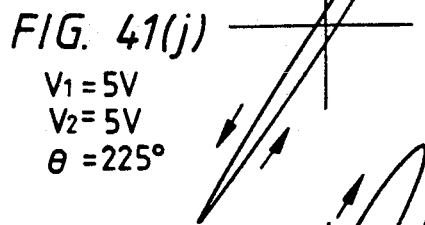
Figure 41K:
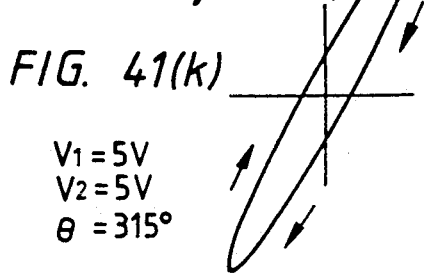

Now, an embodiment relating to the present invention shall be described, referring to the appropriate drawings. FIG. 40 includes a perspective view for showing the structure of one embodiment relating to the present invention.

Figure 42:
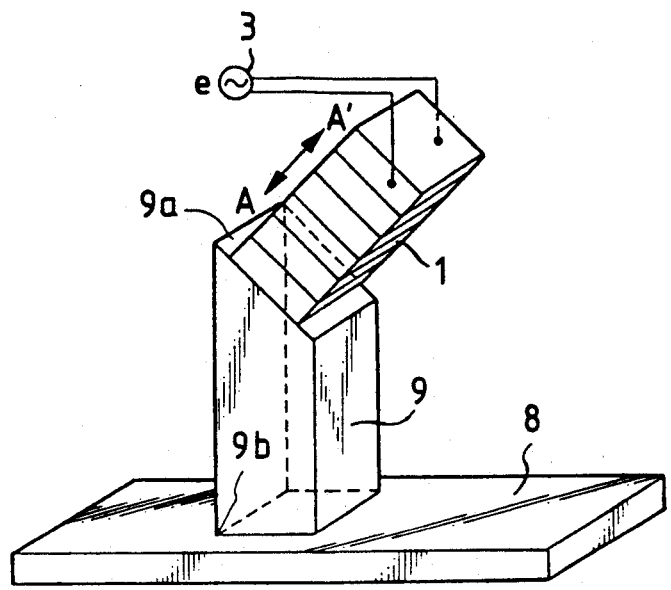
FIG. 42 presents a perspective view of a conventional ultrasonic wave linear actuator, FIG. 43 includes an enlarged diagram of essentials shown in FIG. 42, and FIG. 44 to FIG. 46 correspond to Figures for showing conventional embodiments.
Figure 43:
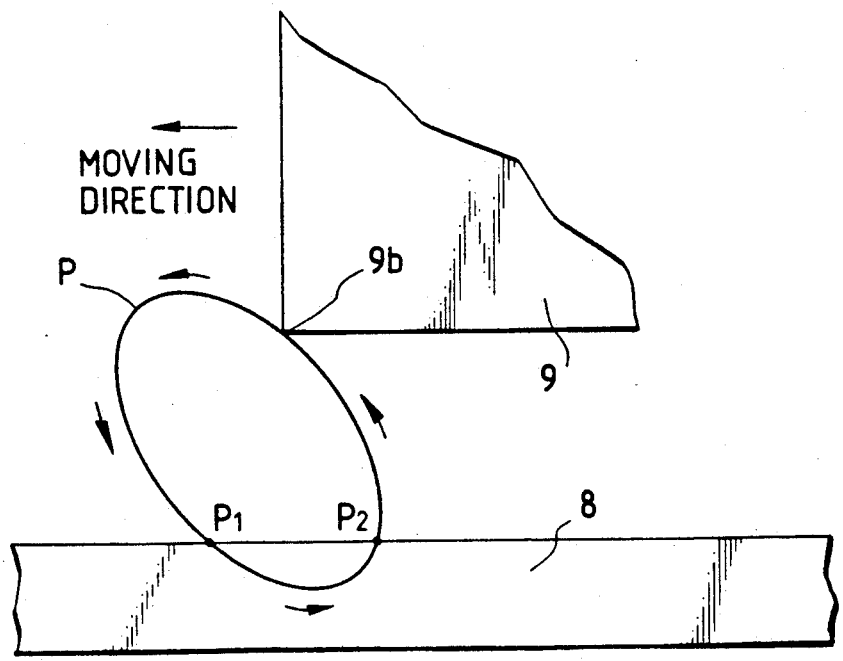
Figure 44:
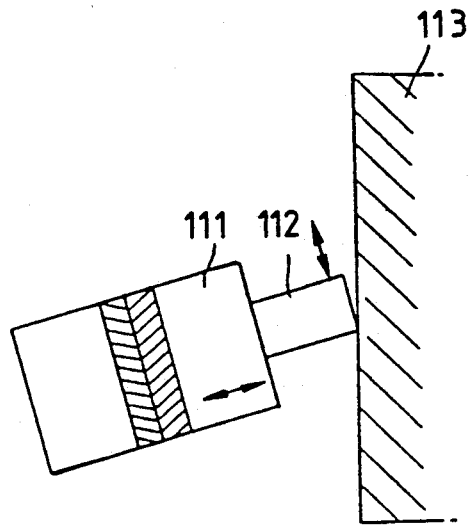
Figure 45:
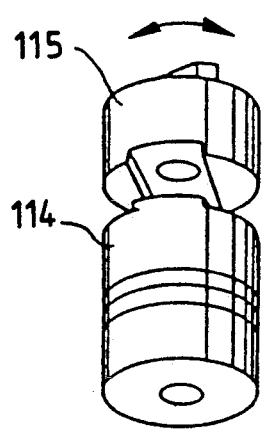
Figure 46:
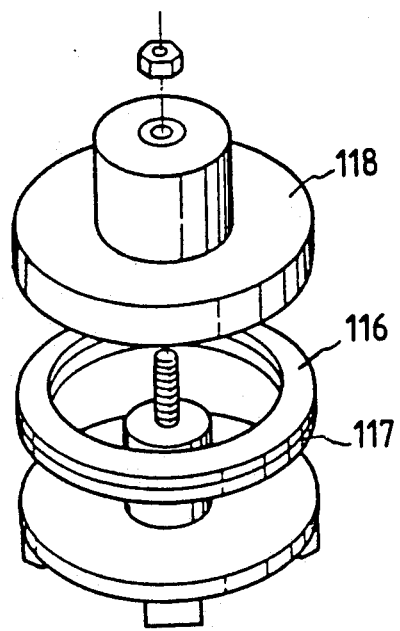

Those parts/portions in this figure corresponding to the same parts/portions in FIG. 42 are given the same symbols as those in FIG. 42 and description shall be neglected therefor.

In this figure, symbol 52 represents an oscillator which is formed in a rectangular prism whose one side is cut out at about 45 deg. to form a slant surface 52a. The bottom surface of the oscillator 51 in a shape of rectangular prism is in contact with the slant surface 52a. The oscillator 52 is in a state to be in forcible contact with a rail 1 under a fixed pressure.

When AC voltage $e_2$ having the same frequency as that of AC voltage $e_1$ is applied to the oscillator 52 as well as the AC voltage $e_1$ is applied to the oscillator 51 in the above-mentioned structure, the oscillator 51 makes extending/contracting movement in A—A' direction and the oscillator 52 makes extending/contracting movement in B—B' direction. Then both kinds of extending/contracting movement are combined together, resulting in making such movement as having its locus forced to follow an elliptical track.

Hereat, provided that the amplitude value of AC voltage $e_1$ is $V_1$, the frequency thereof is f and the period of time concerned is t, the AC voltage $e_1$ is expressed by the following formula.

$$e_1 = v_1 \sin (2\pi ft) \qquad (1)$$

Meanwhile, provided that the amplitude value of AC voltage $e_2$ is $V_2$, and phase difference between AC voltages $e_1$ and $e_2$ is $\theta$, the AC voltage $e_2$ is expressed by the following formula.

$$e_2 = V_2 \sin(2\pi ft + \theta) \quad (2)$$

When the experimental models of oscillators 51 and 52 are manufactured by using PZT (Pb(Zr,Ti)O$_3$) as a piezoelectric material, the efficiency of energy conversion proved to be highest with frequency f at 6.1409 kHz. Frequency f is set to 56.1409 kHz and amplitude values V$_1$, V$_2$ and phase difference $\theta$ are set to various values on the basis of the above results. Then, the resultant elliptical loci of a corner part 52b are shown in FIG. 41(a) to FIG. 41(k). The elliptical loci in the same figure (a) to (f) turn clockwise and those in the same figure (g) to (k) turn counterclockwise. The elliptical loci in the same figure (c) and (d) are comparatively large among the elliptical loci turning clockwise and preferable because of their shapes closer to circles. Meanwhile, the elliptical locus shown in the same figure (h) has a comparatively large oscillatory amplitude among the elliptical loci turning counterclockwise to be considered desirable.

As precisely described in the above-mentioned embodiments, the purpose of the present invention is to install, an oscillatory element which makes oscillation in the direction intersecting the axial line of an oscillatory member, on the oscillatory member formed in an elastic body of a rod shape by using an elastic material, so that a driven body capable of making free movement relatively to the above-mentioned oscillatory member in the direction for intersecting the axial line may be brought in contact with one end of the above oscillatory member, and also to realize an excellent effect representing the possibility to offer an ultrasonic wave linear motor having high efficiency of energy obtained by utilizing the resonant oscillation of the oscillatory member of a simple structure, by transmitting the ultrasonic wave oscillation of an oscillatory element to the oscillatory member so as to excite elliptical oscillations with enlarged values of amplitude on the end of the oscillatory member.

As precisely described in embodiment 2, the purpose of the present invention is to install, a pair of oscillatory element which make oscillation in a direction having mutually equal angles in relation to one plane including the axial line of an oscillatory member, on this oscillatory member formed in a rod shape by using an elastic material on both sides of the above-mentioned one plane, so that a driven body capable of making free movement relatively to the above-mentioned oscillatory member in the direction for intersecting its axial line may be brought in contact with one end of the above oscillatory member and also to realize an excellent effect representing the possibility to offer an ultrasonic wave linear motor which has a simple structure and also high efficiency of energy together with its possibility for exciting elliptical oscillations with effective transmissibility for oscillations, by amplifying and transmitting the ultrasonic oscillations of the oscillatory element in the oscillatory member so as to excite oscillations with large values of amplitude and change their phases by means of AC currents of different phases supplied to a pair of oscillatory element.

As precisely described in the above-mentioned embodiment 3, it is possible by means of the present invention to realize such effects as possibility for making, a straight line movement and also for increasing the efficiency of energy.

As precisely described in the above-mentioned embodiment 4, it is possibly by means of the present invention to realize such effects as possibility for making a straight line movement and also for increasing the efficiency of energy owing to formation of an elastic material approximately in a rod shape and provision of an oscillatory member having a projected surface on one end or both ends thereof, an oscillatory element installed slantly on one end or both ends of the oscillatory member and making oscillation in the direction intersecting the axial line of the oscillatory member, and a driven body having a running surface abutted by the projected surface.

As precisely described in the above-mentioned embodiment 5, it is possible by means of the present invention to realize such effects as possibility for making a straight line movement at a high moving speed and also for increasing the efficiency of energy owing to provision of an oscillator formed by using an elastic material, two oscillatory elements slantly installed on the upper end of the oscillator and making respective proper oscillations in the directions for perpendicularly intersection the plane of installation and a driven body having a running surface abutted by the lower end of the oscillator.

As precisely described in the above-mentioned embodiment 6, it is possible by means of the present invention to easily control an elliptical locus by properly setting the amplitude and phase difference even though the frequencies of voltage applied to respective oscillators are to be set to a fixed value. Accordingly, desirable elliptical loci can be obtained, ever during a period for setting the frequency for increasing the efficiency of energy conversion.

What is claimed is:

1. An ultrasonic wave linear motor comprising:
   an oscillatory piezoelectric element having a direction of oscillation;
   a rod shaped oscillatory member having a longitudinal axis, first and second ends each having a surface intersecting said longitudinal axis, said piezoelectric element being fixedly coupled to said surface of said first end of said rod shaped oscillatory member, wherein the direction of oscillation of the oscillatory piezoelectric element intersects and is noncoaxial with the longitudinal axis of the oscillatory member; and
   a driven body movably coupled to said second end of the oscillatory member.

2. An ultrasonic wave linear motor comprising:
   at least two oscillatory elements each having a direction of oscillation;
   a rod shaped oscillatory member having (i) a longitudinal axis, (ii) a first end having at least two angled surfaces wherein one oscillatory element is fixedly coupled to each angled surface, such that the direction of oscillation of one oscillatory element is different than the direction of oscillation of the other oscillatory element, each direction of oscillation being noncoaxial with the longitudinal axis of the oscillatory member, and (iii) a second end opposite the first end; and
   a driven body movably coupled to said second end of the oscillatory member.

3. An ultrasonic wave linear motor comprising:
   a first rod shaped part with a longitudinal axis;
   a second rod shaped part with a longitudinal axis coupled to the first rod shaped part such that the longitudinal axis of the first rod shaped part forms an angle greater than 0 degrees with the longitudinal axis of the second rod shaped part;

oscillatory elements provided to the first and second rod shaped parts for oscillating in respective longitudinal directions of the first and second rod shaped parts, and a driven body coupled to a bottom end surface of the first rod shaped part.

4. An ultrasonic wave linear motor comprising:

a driven body with an upper surface;

an oscillatory body made of lateral effect piezoelectric material movably coupled to the upper surface of the driven body, said oscillatory body comprising:

first and second leg parts, one end of each leg part being movably coupled to the driven body, another end being chamfered, each leg part positioned such that its longitudinal axis is approximately perpendicular to the upper surface of the driven body, said first and second leg parts serving as both oscillatory elements and oscillatory members; and a connecting member with first and second ends, said first and second ends of the connecting member being chamfered and coupled to the chamfered ends of the first and second leg parts, respectively, the connecting member positioned approximately perpendicular to the leg parts and approximately parallel to the direction of relative motion between the driven body and the oscillatory body, said connecting member serving as both an oscillatory element and oscillatory member, a first pair of electrodes, one electrode being attached to one of opposing sides and another electrode being attached to the other of the opposing sides of said first leg part and an adjacent first portion of the connecting member; and a second pair of electrodes, one electrode being attached to said one of the opposing sides and another electrode being attached to said other of the opposing sides of said second leg part and an adjacent second portion of the connecting portion, said second pair of electrodes being insulated from the first pair of electrodes.

5. An ultrasonic wave linear motor comprising:

a moveable driven body;

a longitudinal oscillatory member having two ends, wherein a first end is movably coupled to the driven body and a second end has a faceted surface with at least two subsurfaces, at least two oscillatory elements, one oscillatory element being attached to one subsurface and another oscillatory element being attached to the other subsurface of the faceted surface of the oscillatory member so that a longitudinal axis of each oscillatory element is noncoaxial with the longitudinal axis of the oscillatory member.

6. An ultrasonic wave linear motor comprising:

a driven body having a grooved surface;

an oscillatory member having a direction of motion, said oscillatory member being longitudinally extended in the direction of motion, the oscillatory member further having two ends wherein a first end has an angled surface, and a second end opposite said first end has a projection in contact with the grooved surface of the driven body;

a sliding member abutted to the projection and applied to a surface of the oscillatory member facing the driven body; and an oscillatory element coupled to the angled surface of the oscillatory member for generating and transmitting oscillations to the projection, such that a longitudinal axis of the oscillatory element is noncoaxial with a longitudinal axis of the oscillatory member.

7. An ultrasonic wave linear motor comprising:

a pair of leg parts each comprising a plurality of longitudinal effect piezoelectric plates laminated together in a longitudinal direction;

a bridge part comprising a plurality of longitudinal effect piezoelectric plates laminated together and to an essentially triangular shaped piezoelectric plate at each end, each said triangular plate connecting one end of each leg part with said bridge part essentially forming a U-shape; and a plurality of electrodes, wherein individual electrodes are sandwiched between adjacent ones of said longitudinal effect piezoelectric plates.

8. An ultrasonic wave linear motor comprising:

a plurality of wedge-shaped longitudinal effect piezoelectric plates laminated together in a longitudinal direction essentially forming an arch-shape; and a plurality of electrodes, wherein individual electrodes are sandwiched between adjacent ones of said wedge-shaped piezoelectric plates.

9. The ultrasonic wave linear motor according to claim 2, wherein there is an angle of 45 degrees between the longitudinal axis of the oscillatory member and the direction of oscillation of each oscillatory element.

10. An ultrasonic wave linear motor according to claim 1 wherein said surface defines a first plane which intersects said longitudinal axis at an angle, and said driven body is restricted to move only in a direction perpendicular to said longitudinal axis.

* * * * *